(12) United States Patent
Brabender et al.

(10) Patent No.: US 9,738,967 B2
(45) Date of Patent: Aug. 22, 2017

(54) SPUTTERING APPARATUS INCLUDING TARGET MOUNTING AND CONTROL

(71) Applicant: Cardinal CG Company, Eden Prairie, MN (US)

(72) Inventors: Dennis M Brabender, Buford, GA (US); Jeffrey L Kokoschke, Flowery Branch, GA (US)

(73) Assignee: CARDINAL CG COMPANY, Eden Prairie, MN (US)

( * ) Notice: Subject to any disclaimer, the term of this patent is extended or adjusted under 35 U.S.C. 154(b) by 0 days.

(21) Appl. No.: 13/626,295

(22) Filed: Sep. 25, 2012

(65) Prior Publication Data

US 2013/0220795 A1    Aug. 29, 2013

Related U.S. Application Data

(63) Continuation of application No. 11/485,615, filed on Jul. 12, 2006, now abandoned.

(51) Int. Cl.
| | |
|---|---|
| *C23C 14/35* | (2006.01) |
| *C23C 14/34* | (2006.01) |
| *H01J 37/34* | (2006.01) |
| *H01J 37/32* | (2006.01) |
| *C23C 14/56* | (2006.01) |

(52) U.S. Cl.
CPC ........ *C23C 14/352* (2013.01); *C23C 14/3414* (2013.01); *C23C 14/3464* (2013.01); *C23C 14/56* (2013.01); *H01J 37/32458* (2013.01); *H01J 37/32752* (2013.01); *H01J 37/342* (2013.01); *H01J 37/3417* (2013.01); *H01J 37/3447* (2013.01)

(58) Field of Classification Search
CPC .......... H01J 37/32458; H01J 37/32752; H01J 37/342; H01J 37/3417; H01J 37/3414
USPC .......................... 204/298.26, 298.21, 192.12
See application file for complete search history.

(56) References Cited

U.S. PATENT DOCUMENTS

| | | |
|---|---|---|
| 1,256,818 A | 2/1918 | Nile |
| 2,082,582 A | 6/1937 | Kling |

(Continued)

FOREIGN PATENT DOCUMENTS

| | | |
|---|---|---|
| CA | 2290999 | 5/1998 |
| DE | 3906453 | 9/1990 |

(Continued)

OTHER PUBLICATIONS

Anderson et al., An Improved Photocatalyst of $TiO_2/SiO_2$ prepared by a Sol-Gel Synthesis, J. Phys. Chem., vol. 99 (1995) pp. 9882-9885.

(Continued)

*Primary Examiner* — Jason M Berman
(74) *Attorney, Agent, or Firm* — Fredrikson & Byron, P.A.

(57) ABSTRACT

A sputtering chamber includes at least two sputtering targets, one of the at least two targets disposed on a first side a substrate conveyor extending within the chamber, and another of the at least two targets disposed on a second side of the conveyor. The at least two targets may be independently operable, and at least one of the targets, if inactivated, may be protected by a shielding apparatus. Both of the at least two targets may be mounted to a first wall of a plurality of walls enclosing the sputtering chamber.

29 Claims, 6 Drawing Sheets

(56) References Cited

U.S. PATENT DOCUMENTS

| | | |
|---|---|---|
| 2,808,351 A | 10/1952 | Colbert |
| 2,780,553 A | 2/1957 | Pawlyk |
| 3,284,181 A | 11/1966 | Harrell |
| 3,505,092 A | 4/1970 | Ryan |
| 3,528,906 A | 9/1970 | Cash, Jr. |
| 3,679,291 A | 7/1972 | Apfel |
| 3,727,666 A | 4/1973 | Vandersluis |
| 3,829,197 A | 8/1974 | Thelen |
| 3,840,451 A | 10/1974 | Golyanov |
| 3,844,924 A | 10/1974 | Cunningham |
| 3,852,098 A | 12/1974 | Bloss |
| 3,854,796 A | 12/1974 | Thelen |
| 3,911,579 A | 10/1975 | Lane |
| 3,925,182 A | 12/1975 | Carmichael |
| 3,934,961 A | 1/1976 | Itoh |
| 3,968,018 A | 7/1976 | Lane |
| 3,970,037 A | 7/1976 | Sopko |
| 3,990,784 A | 11/1976 | Gelber |
| 4,012,119 A | 3/1977 | Adams |
| 4,029,566 A | 6/1977 | Brandmair |
| 4,045,125 A | 8/1977 | Farges |
| 4,052,520 A | 10/1977 | Chang |
| 4,060,660 A | 11/1977 | Carlson |
| 4,107,350 A | 8/1978 | Berg |
| 4,130,672 A | 12/1978 | Onoki |
| 4,166,018 A | 8/1979 | Chapin |
| 4,194,022 A | 3/1980 | Gillery |
| 4,212,663 A | 7/1980 | Aslami |
| 4,212,903 A | 7/1980 | Schnell |
| 4,214,014 A | 7/1980 | Hofer |
| 4,216,259 A | 8/1980 | Groth |
| 4,238,276 A | 12/1980 | Kinugawa |
| 4,252,629 A | 2/1981 | Bewer |
| 4,261,722 A | 4/1981 | Novak |
| 4,322,276 A | 3/1982 | Meckel |
| 4,331,526 A | 5/1982 | Kuehnle |
| 4,332,922 A | 6/1982 | Kossmehl |
| 4,336,118 A | 6/1982 | Patten |
| 4,336,119 A | 6/1982 | Gillery |
| 4,351,861 A | 9/1982 | Henery |
| 4,356,073 A | 10/1982 | McKelvey |
| 4,377,613 A | 3/1983 | Gordon |
| 4,422,916 A | 12/1983 | McKelvey |
| 4,422,917 A | 12/1983 | Hayfield |
| 4,440,822 A | 4/1984 | Gordon |
| 4,465,575 A | 8/1984 | Love |
| 4,466,258 A | 8/1984 | Sando |
| 4,466,877 A | 8/1984 | McKelvey |
| 4,485,146 A | 11/1984 | Mizuhashi |
| 4,486,286 A | 12/1984 | Lewin |
| 4,503,125 A | 3/1985 | Nelson |
| 4,504,519 A | 3/1985 | Zelez |
| 4,556,599 A | 12/1985 | Sato |
| 4,568,622 A | 2/1986 | Minami |
| 4,569,738 A | 2/1986 | Kieser |
| 4,571,350 A | 2/1986 | Parker |
| 4,576,864 A | 3/1986 | Krautter |
| 4,661,409 A | 4/1987 | Kieser |
| 4,663,234 A | 5/1987 | Bouton |
| 4,673,475 A | 6/1987 | Windischmann |
| 4,692,428 A | 9/1987 | Murrell |
| 4,704,339 A | 11/1987 | Green |
| 4,713,311 A | 12/1987 | Senske |
| 4,717,622 A | 1/1988 | Kurokawa |
| 4,725,345 A | 2/1988 | Sakamoto |
| 4,728,529 A | 3/1988 | Etzkorn |
| 4,732,454 A | 3/1988 | Saito |
| 4,737,252 A | 4/1988 | Hoffman |
| 4,769,291 A | 9/1988 | Belkind |
| 4,777,090 A | 10/1988 | Ovshinsky |
| 4,780,334 A | 10/1988 | Ackerman |
| 4,798,660 A | 1/1989 | Ermer |
| 4,806,220 A | 2/1989 | Finley |
| 4,814,056 A | 3/1989 | Welty |
| 4,816,127 A | 3/1989 | Eltoukhy |
| 4,834,857 A | 5/1989 | Gillery |
| 4,838,935 A | 6/1989 | Dunlop |
| 4,849,081 A | 7/1989 | Ross |
| 4,851,095 A | 7/1989 | Scobey |
| 4,854,670 A | 8/1989 | Mellor |
| 4,859,493 A | 8/1989 | Lemelson |
| 4,861,680 A | 8/1989 | Meyer |
| 4,882,827 A | 11/1989 | Kusumi |
| 4,883,574 A | 11/1989 | Dossantos |
| 4,883,721 A | 11/1989 | Nalepka |
| 4,894,133 A | 1/1990 | Hedgcoth |
| 4,894,290 A | 1/1990 | Chesworth |
| 4,902,580 A | 2/1990 | Gillery |
| 4,915,977 A | 4/1990 | Okamoto |
| 4,919,778 A | 4/1990 | Dietrich |
| 4,931,158 A | 6/1990 | Bunshah |
| 4,931,213 A | 6/1990 | Cass |
| 4,931,315 A | 6/1990 | Mellor |
| 4,931,778 A | 6/1990 | Guajardo |
| 4,940,636 A | 7/1990 | Brock |
| 4,952,430 A | 8/1990 | Bowser |
| 4,954,465 A | 9/1990 | Kawashima |
| 4,961,958 A | 10/1990 | Desphandey |
| 4,963,240 A | 10/1990 | Fukasawa |
| 4,981,568 A | 1/1991 | Taranko |
| 4,990,234 A | 2/1991 | Szczyrbowski |
| 4,995,893 A | 2/1991 | Jenkins |
| 4,997,576 A | 3/1991 | Heller |
| 5,006,248 A | 4/1991 | Anderson |
| 5,008,002 A | 4/1991 | Uno |
| 5,020,288 A | 6/1991 | Swensen |
| 5,026,415 A | 6/1991 | Yamamoto |
| 5,032,421 A | 7/1991 | Sarma |
| 5,035,784 A | 7/1991 | Anderson |
| 5,047,131 A | 9/1991 | Wolfe |
| 5,071,206 A | 12/1991 | Hood |
| 5,073,241 A | 12/1991 | Watanabe |
| 5,073,450 A | 12/1991 | Nietering |
| 5,073,451 A | 12/1991 | Iida |
| 5,090,985 A | 2/1992 | Soubeyrand |
| 5,096,562 A | 3/1992 | Boozenny |
| 5,104,539 A | 4/1992 | Anderson |
| 5,105,310 A | 4/1992 | Dickey |
| 5,106,671 A | 4/1992 | Amberger |
| 5,107,643 A | 4/1992 | Swensen |
| 5,108,574 A | 4/1992 | Kirs |
| 5,110,637 A | 5/1992 | Ando |
| 5,126,218 A | 6/1992 | Clarke |
| RE34,035 E | 8/1992 | Dimigen |
| 5,139,633 A | 8/1992 | Kashida |
| 5,160,534 A | 11/1992 | Hiraki |
| 5,165,972 A | 11/1992 | Porter |
| 5,168,003 A | 12/1992 | Proscia |
| 5,171,414 A | 12/1992 | Amberger |
| 5,176,897 A | 1/1993 | Lester |
| 5,179,468 A | 1/1993 | Gasloli |
| 5,190,807 A | 3/1993 | Kimock |
| 5,194,990 A | 3/1993 | Boulos |
| 5,196,400 A | 3/1993 | Chen |
| 5,201,926 A | 4/1993 | Szczyrbowski |
| 5,209,996 A | 5/1993 | Kashida |
| 5,211,759 A | 5/1993 | Zimmermann |
| 5,216,542 A | 6/1993 | Szczyrbowski |
| 5,234,487 A | 8/1993 | Wickersham, Jr. |
| 5,244,554 A | 9/1993 | Yamagata |
| 5,245,468 A | 9/1993 | Demiryont |
| 5,254,392 A | 10/1993 | Burns |
| 5,284,539 A | 2/1994 | McKernan |
| 5,286,524 A | 2/1994 | Slutz |
| 5,298,048 A | 3/1994 | Lingle |
| 5,298,338 A | 3/1994 | Hiraki |
| 5,302,449 A | 4/1994 | Eby |
| 5,306,547 A | 4/1994 | Hood |
| 5,306,569 A | 4/1994 | Hiraki |
| 5,318,830 A | 6/1994 | Takamatsu |
| 5,338,422 A | 8/1994 | Belkind |
| 5,342,676 A | 8/1994 | Zagdoun |
| 5,346,600 A | 9/1994 | Nieh |
| 5,354,446 A | 10/1994 | Kida |

(56) References Cited

U.S. PATENT DOCUMENTS

| | | |
|---|---|---|
| 5,356,718 A | 10/1994 | Athey |
| 5,366,764 A | 11/1994 | Sunthankar |
| 5,378,527 A | 1/1995 | Nakanishi |
| 5,394,269 A | 2/1995 | Takamatsu |
| 5,397,050 A | 3/1995 | Mueller |
| 5,401,543 A | 3/1995 | O'Neill |
| 5,405,517 A | 4/1995 | Lampkin |
| 5,415,756 A | 5/1995 | Wolfe |
| 5,417,827 A | 5/1995 | Finley |
| 5,424,130 A | 6/1995 | Nakanishi |
| 5,453,459 A | 9/1995 | Roberts |
| 5,464,518 A | 11/1995 | Sieck |
| 5,470,527 A | 11/1995 | Yamanobe |
| 5,470,661 A | 11/1995 | Bailey |
| 5,476,713 A | 12/1995 | Abiko |
| 5,482,602 A | 1/1996 | Cooper |
| 5,496,621 A | 3/1996 | Makita |
| 5,498,475 A | 3/1996 | Takigawa |
| 5,507,930 A | 4/1996 | Yamashita |
| 5,512,152 A | 4/1996 | Schicht |
| 5,513,039 A | 4/1996 | Lu |
| 5,514,485 A | 5/1996 | Ando |
| 5,520,996 A | 5/1996 | Balian |
| 5,525,406 A | 6/1996 | Goodman |
| 5,527,755 A | 6/1996 | Wenski |
| 5,529,631 A | 6/1996 | Yoshikawa |
| 5,552,180 A | 9/1996 | Finley |
| 5,558,751 A | 9/1996 | Mahler |
| 5,563,734 A | 10/1996 | Wolfe |
| 5,569,362 A | 10/1996 | Lerbet |
| 5,569,501 A | 10/1996 | Bailey |
| 5,589,280 A | 12/1996 | Gibbons |
| 5,593,784 A | 1/1997 | Chinzi |
| 5,593,786 A | 1/1997 | Parker |
| 5,594,585 A | 1/1997 | Komatsu |
| 5,595,813 A | 1/1997 | Ogawa |
| 5,595,825 A | 1/1997 | Guiselin |
| 5,597,622 A | 1/1997 | Zoller |
| 5,599,422 A | 2/1997 | Adams |
| 5,605,609 A | 2/1997 | Ando et al. |
| 5,607,723 A | 3/1997 | Plano |
| 5,609,924 A | 3/1997 | McCurdy |
| 5,611,899 A | 3/1997 | Maass |
| 5,616,225 A | 4/1997 | Sieck |
| 5,616,532 A | 4/1997 | Heller |
| 5,618,388 A | 4/1997 | Seeser |
| 5,618,590 A | 4/1997 | Naruse |
| 5,620,572 A | 4/1997 | Bjornard |
| 5,620,577 A | 4/1997 | Taylor |
| 5,624,423 A | 4/1997 | Anjur |
| 5,624,760 A | 4/1997 | Collins |
| 5,633,208 A | 5/1997 | Ishikawa |
| 5,635,287 A | 6/1997 | Balian |
| 5,643,423 A | 7/1997 | Kimock |
| 5,643,432 A | 7/1997 | Qiu |
| 5,645,699 A | 7/1997 | Sieck |
| 5,645,900 A | 7/1997 | Ong |
| 5,651,867 A | 7/1997 | Kokaku |
| 5,669,144 A | 9/1997 | Hahn |
| 5,674,625 A | 10/1997 | Takahashi |
| 5,674,658 A | 10/1997 | Burberry |
| 5,679,431 A | 10/1997 | Chen |
| 5,679,978 A | 10/1997 | Kawahara |
| 5,683,560 A | 11/1997 | Szczyrbowski |
| 5,683,561 A | 11/1997 | Hollars |
| 5,686,372 A | 11/1997 | Langford |
| 5,693,199 A | 12/1997 | Bourez |
| 5,698,262 A | 12/1997 | Soubeyrand |
| 5,715,103 A | 2/1998 | Amano |
| 5,719,705 A | 2/1998 | Machol |
| 5,723,172 A | 3/1998 | Sherman |
| 5,724,187 A | 3/1998 | Varaprasad |
| 5,725,746 A | 3/1998 | Dickey |
| 5,733,660 A | 3/1998 | Makita |
| 5,733,669 A | 3/1998 | Veyhl |
| 5,744,215 A | 4/1998 | Neuman |
| 5,745,291 A | 4/1998 | Jenkinson |
| 5,750,265 A | 5/1998 | Goodman |
| 5,755,867 A | 5/1998 | Chikuni |
| 5,762,674 A | 6/1998 | Maltby, Jr. |
| 5,762,766 A | 6/1998 | Kurita |
| 5,763,087 A | 6/1998 | Falabella |
| 5,780,119 A | 7/1998 | Dearnaley |
| 5,780,149 A | 7/1998 | McCurdy |
| 5,780,380 A | 7/1998 | Endoh |
| 5,789,040 A | 8/1998 | Martinu |
| 5,811,191 A | 9/1998 | Neuman |
| 5,812,405 A | 9/1998 | Meredith, Jr. |
| 5,814,195 A | 9/1998 | Lehan |
| 5,814,196 A | 9/1998 | Hollars |
| 5,820,994 A | 10/1998 | Gotoh |
| 5,827,490 A | 10/1998 | Jones |
| 5,830,252 A | 11/1998 | Finley |
| 5,830,327 A | 11/1998 | Kolenkow |
| 5,830,332 A | 11/1998 | Babich |
| 5,846,613 A | 12/1998 | Neuville |
| 5,849,200 A | 12/1998 | Heller |
| 5,853,866 A | 12/1998 | Watanabe et al. |
| 5,854,169 A | 12/1998 | Heller |
| 5,854,708 A | 12/1998 | Komatsu |
| 5,863,398 A | 1/1999 | Kardokus |
| 5,866,199 A | 2/1999 | Swidler |
| 5,866,260 A | 2/1999 | Adams, Jr. |
| 5,869,187 A | 2/1999 | Nakamura |
| 5,869,808 A | 2/1999 | Hyllberg |
| 5,871,843 A | 2/1999 | Yoneda |
| 5,873,203 A | 2/1999 | Thiel |
| 5,874,701 A | 2/1999 | Watanabe |
| 5,877,391 A | 3/1999 | Kanno |
| 5,888,593 A | 3/1999 | Petrmichl |
| 5,891,556 A | 4/1999 | Anderson |
| 5,896,553 A | 4/1999 | Lo |
| 5,897,957 A | 4/1999 | Goodman |
| 5,935,716 A | 8/1999 | McCurdy |
| 5,939,188 A | 8/1999 | Moncur |
| 5,939,194 A | 8/1999 | Hashimoto |
| 5,939,201 A | 8/1999 | Boire |
| 5,948,538 A | 9/1999 | Brochot |
| 5,961,843 A | 10/1999 | Hayakawa |
| 5,962,115 A | 10/1999 | Zmelty |
| 5,965,246 A | 10/1999 | Guiselin |
| 5,968,328 A | 10/1999 | Teschner |
| 5,972,184 A | 10/1999 | Hollars |
| 5,981,426 A | 11/1999 | Langford |
| 5,993,734 A | 11/1999 | Snowman |
| 6,010,602 A | 1/2000 | Arbab |
| 6,013,372 A | 1/2000 | Hayakawa et al. |
| 6,027,766 A | 2/2000 | Greenberg |
| 6,037,289 A | 3/2000 | Chopin |
| 6,040,939 A | 3/2000 | Demiryont |
| 6,045,903 A | 4/2000 | Seino |
| 6,046,403 A | 4/2000 | Yoshikawa |
| 6,054,024 A | 4/2000 | Toyama |
| 6,054,227 A | 4/2000 | Greenberg |
| 6,068,914 A | 5/2000 | Boire |
| 6,071,606 A | 6/2000 | Yamazaki |
| 6,071,623 A | 6/2000 | Sugawara et al. |
| 6,074,981 A | 6/2000 | Tada |
| 6,077,482 A | 6/2000 | Kanno |
| 6,077,492 A | 6/2000 | Anpo |
| 6,090,489 A | 7/2000 | Hayakawa |
| 6,103,363 A | 8/2000 | Boire |
| 6,114,043 A | 9/2000 | Joret |
| 6,120,747 A | 9/2000 | Sugishima |
| 6,124,044 A | 9/2000 | Swidler |
| 6,139,803 A | 10/2000 | Watanabe |
| 6,139,968 A | 10/2000 | Knapp |
| 6,153,067 A | 11/2000 | Maishev |
| 6,154,311 A | 11/2000 | Simmons |
| 6,156,171 A | 12/2000 | Hollars |
| 6,156,409 A | 12/2000 | Doushita |
| 6,165,256 A | 12/2000 | Hayakawa |
| 6,165,598 A | 12/2000 | Nelson |
| 6,165,616 A | 12/2000 | Lemelson |

(56) References Cited

U.S. PATENT DOCUMENTS

| | | |
|---|---|---|
| 6,171,659 B1 | 1/2001 | Vanden Brande |
| 6,179,971 B1 | 1/2001 | Kittrell |
| 6,179,972 B1 | 1/2001 | Kittrell |
| 6,191,062 B1 | 2/2001 | Hayakawa |
| 6,193,378 B1 | 2/2001 | Tonar |
| 6,193,856 B1 | 2/2001 | Kida |
| 6,194,346 B1 | 2/2001 | Tada |
| 6,197,101 B1 | 3/2001 | Matsumura |
| 6,210,750 B1 | 4/2001 | Cho |
| 6,210,779 B1 | 4/2001 | Watanabe |
| 6,228,480 B1 | 5/2001 | Kimura |
| 6,228,502 B1 | 5/2001 | Saitoh |
| 6,238,738 B1 | 5/2001 | McCurdy |
| 6,242,752 B1 | 6/2001 | Soma |
| 6,248,397 B1 | 6/2001 | Ye |
| 6,261,693 B1 | 7/2001 | Veerasamy |
| 6,270,633 B1 | 8/2001 | Onaka |
| 6,274,244 B1 | 8/2001 | Finley |
| 6,299,981 B1 | 10/2001 | Azzopardi |
| 6,319,326 B1 | 11/2001 | Koh |
| 6,326,079 B1 | 12/2001 | Philippe |
| 6,329,060 B1 | 12/2001 | Barkac |
| 6,329,925 B1 | 12/2001 | Skiver |
| 6,333,084 B1 | 12/2001 | Woodard |
| 6,334,938 B2 | 1/2002 | Kida |
| 6,335,479 B1 | 1/2002 | Yamada |
| 6,336,998 B1 | 1/2002 | Wang |
| 6,337,124 B1 | 1/2002 | Anderson |
| 6,338,777 B1 | 1/2002 | White |
| 6,346,174 B1 | 2/2002 | Finley |
| 6,350,397 B1 | 2/2002 | Heikkila |
| 6,352,755 B1 | 3/2002 | Finley |
| 6,354,109 B1 | 3/2002 | Boire |
| 6,362,121 B1 | 3/2002 | Chopin |
| 6,365,010 B1 | 4/2002 | Hollars |
| 6,365,014 B2 | 4/2002 | Finley |
| 6,368,664 B1 | 4/2002 | Veerasamy |
| 6,368,668 B1 | 4/2002 | Kobayashi |
| 6,379,746 B1 | 4/2002 | Birch |
| 6,379,764 B1 | 4/2002 | Pusateri |
| 6,379,776 B1 | 4/2002 | Tada |
| 6,387,844 B1 | 5/2002 | Fujishima |
| 6,403,689 B1 | 6/2002 | Lehaut |
| 6,413,581 B1 | 7/2002 | Greenberg |
| 6,413,604 B1 | 7/2002 | Matthews |
| 6,414,213 B2 | 7/2002 | Ohmori |
| 6,419,800 B2 | 7/2002 | Anzaki |
| 6,425,670 B1 | 7/2002 | Komatsu |
| 6,428,172 B1 | 8/2002 | Hutzel |
| 6,436,542 B1 | 8/2002 | Ogino |
| 6,440,278 B1 | 8/2002 | Kida |
| 6,447,123 B2 | 9/2002 | Tonar |
| 6,451,178 B2 | 9/2002 | Szczyrbowski |
| 6,461,686 B1 | 10/2002 | Vanderstraeten |
| 6,464,951 B1 | 10/2002 | Kittrell |
| 6,465,088 B1 | 10/2002 | Talpaert |
| 6,468,402 B1 | 10/2002 | Vanderstraeten |
| 6,468,403 B1 | 10/2002 | Shimizu |
| 6,468,428 B1 | 10/2002 | Nishii |
| 6,488,824 B1 | 12/2002 | Hollars |
| 6,500,690 B1 | 12/2002 | Yamagishi |
| 6,501,387 B2 | 12/2002 | Skiver |
| 6,511,309 B1 | 1/2003 | Hunter |
| 6,511,587 B2 | 1/2003 | Vanderstraeten |
| 6,570,709 B2 | 5/2003 | Katayama |
| 6,571,729 B2 | 6/2003 | Sasaki et al. |
| 6,576,344 B1 | 6/2003 | Doushita |
| 6,582,839 B1 | 6/2003 | Yamamoto |
| 6,596,664 B2 | 7/2003 | Kittrell |
| 6,635,155 B2 | 10/2003 | Miyamura |
| 6,652,974 B1 | 11/2003 | Krisko |
| 6,660,365 B1 | 12/2003 | Krisko |
| 6,673,738 B2 | 1/2004 | Ueda |
| 6,677,063 B2 | 1/2004 | Finley |
| 6,679,978 B2 | 1/2004 | Johnson |
| 6,680,135 B2 | 1/2004 | Boire |
| 6,682,773 B2 | 1/2004 | Medwick |
| 6,716,323 B1 | 4/2004 | Siddle |
| 6,720,066 B2 | 4/2004 | Talpaert |
| 6,722,159 B2 | 4/2004 | Greenberg |
| 6,730,630 B2 | 5/2004 | Okusako |
| 6,733,889 B2 | 5/2004 | Veerasamy |
| 6,743,343 B2 | 6/2004 | Kida |
| 6,743,749 B2 | 6/2004 | Morikawa |
| 6,761,984 B2 | 7/2004 | Anzaki |
| 6,770,321 B2 | 8/2004 | Hukari |
| 6,777,030 B2 | 8/2004 | Veerasamy |
| 6,777,091 B2 | 8/2004 | Kijima |
| 6,781,738 B2 | 8/2004 | Kikuchi |
| 6,787,199 B2 | 9/2004 | Anpo |
| 6,789,906 B2 | 9/2004 | Tonar |
| 6,794,065 B1 | 9/2004 | Morikawa |
| 6,800,182 B2 | 10/2004 | Mitsui |
| 6,800,183 B2 | 10/2004 | Takahashi |
| 6,800,354 B2 | 10/2004 | Baumann |
| 6,804,048 B2 | 10/2004 | MacQuart |
| 6,811,856 B2 | 11/2004 | Nun |
| 6,818,309 B1 | 11/2004 | Talpaert |
| 6,829,084 B2 | 12/2004 | Takaki |
| 6,830,785 B1 | 12/2004 | Hayakawa |
| 6,833,089 B1 | 12/2004 | Kawahara |
| 6,835,688 B2 | 12/2004 | Morikawa |
| 6,840,061 B1 | 1/2005 | Hurst |
| 6,846,556 B2 | 1/2005 | Boire |
| 6,849,328 B1 | 2/2005 | Marietti |
| 6,869,644 B2 | 3/2005 | Buhay |
| 6,870,657 B1 | 3/2005 | Fitzmaurice |
| 6,872,441 B2 | 3/2005 | Baumann |
| 6,875,319 B2 | 4/2005 | Nadaud |
| 6,878,242 B2 | 4/2005 | Wang |
| 6,878,450 B2 | 4/2005 | Anpo |
| 6,881,701 B2 | 4/2005 | Jacobs |
| 6,890,656 B2 | 5/2005 | Iacovangelo |
| 6,902,813 B2 | 6/2005 | O'Shaughnessy |
| 6,908,698 B2 | 6/2005 | Yoshida |
| 6,908,881 B1 | 6/2005 | Sugihara |
| 6,916,542 B2 | 7/2005 | Buhay |
| 6,921,579 B2 | 7/2005 | O'Shaughnessy |
| 6,929,862 B2 | 8/2005 | Hurst |
| 6,939,446 B2 | 9/2005 | Krisko |
| 6,939,611 B2 | 9/2005 | Fujishima |
| 6,952,299 B1 | 10/2005 | Fukazawa |
| 6,954,240 B2 | 10/2005 | Hamamoto |
| 6,962,759 B2 | 11/2005 | Buhay |
| 6,964,731 B1 | 11/2005 | Krisko |
| 6,974,629 B1 | 12/2005 | Krisko |
| 6,997,570 B2 | 2/2006 | Nakaho |
| 7,005,188 B2 | 2/2006 | Anderson |
| 7,005,189 B1 | 2/2006 | Tachibana |
| 7,011,691 B2 | 3/2006 | Abe |
| 7,022,416 B2 | 4/2006 | Teranishi |
| 7,049,002 B2 | 5/2006 | Greenberg |
| 7,052,585 B2 | 5/2006 | Veerasamy |
| 7,060,643 B2 | 6/2006 | Sanbayashi |
| 7,096,692 B2 | 8/2006 | Greenberg |
| 7,118,936 B2 | 10/2006 | Kobayashi |
| 7,138,181 B2 | 11/2006 | McCurdy |
| 7,157,840 B2 | 1/2007 | Fujishima |
| 7,166,199 B2 | 1/2007 | Hartig |
| 7,175,911 B2 | 2/2007 | Zhou |
| 7,179,527 B2 | 2/2007 | Sato |
| 7,195,821 B2 | 3/2007 | Tixhon |
| 7,198,699 B2 | 4/2007 | Thomsen |
| 7,211,513 B2 | 5/2007 | Remington |
| 7,211,543 B2 | 5/2007 | Nakabayash |
| 7,223,523 B2 | 5/2007 | Boykin |
| 7,232,615 B2 | 6/2007 | Buhay |
| 7,255,831 B2 | 8/2007 | Wei |
| 7,261,942 B2 | 8/2007 | Andrews |
| 7,264,741 B2 | 9/2007 | Hartig |
| 7,294,365 B2 | 11/2007 | Hayakawa |
| 7,294,403 B2 | 11/2007 | Krisko |
| 7,294,404 B2 | 11/2007 | Hartig |
| 7,300,634 B2 | 11/2007 | Yaniv |

(56) References Cited

U.S. PATENT DOCUMENTS

| | | |
|---|---|---|
| 7,309,405 B2 | 12/2007 | Cho |
| 7,309,527 B2 | 12/2007 | O'Shaughnessy |
| 7,309,664 B1 | 12/2007 | Marzolin |
| 7,311,961 B2 | 12/2007 | Finley |
| 7,320,827 B2 | 1/2008 | Fujisawa |
| 7,323,249 B2 | 1/2008 | Athey |
| 7,339,728 B2 | 3/2008 | Hartig |
| 7,342,716 B2 | 3/2008 | Hartig |
| 7,348,054 B2 | 3/2008 | Jacquiod |
| 7,354,624 B2 | 4/2008 | Millero |
| 7,361,963 B2 | 4/2008 | Ikadai |
| 7,387,839 B2 | 6/2008 | Gueneau |
| 7,491,301 B2 | 2/2009 | Krisko |
| 7,534,466 B2 | 5/2009 | Hartig |
| 7,572,509 B2 | 8/2009 | Hartig |
| 7,572,510 B2 | 8/2009 | Hartig |
| 7,572,511 B2 | 8/2009 | Hartig |
| 7,604,865 B2 | 10/2009 | Krisko |
| 7,713,632 B2 | 5/2010 | Krisko |
| 7,749,364 B2 | 7/2010 | Hartig |
| 7,820,296 B2 | 10/2010 | Myli |
| 7,820,309 B2 | 10/2010 | Myli |
| 7,862,910 B2 | 1/2011 | Krisko |
| 7,906,203 B2 | 3/2011 | Hartig |
| 7,923,114 B2 | 4/2011 | Myli |
| 8,092,657 B2 * | 1/2012 | De Bosscher et al. .... 204/192.1 |
| 8,092,660 B2 | 1/2012 | Myli |
| RE43,817 E | 11/2012 | Krisko |
| RE44,155 E | 4/2013 | Krisko |
| 8,506,768 B2 | 8/2013 | Myli |
| 8,696,879 B2 | 4/2014 | Myli |
| 2001/0007715 A1 | 7/2001 | Toyoshima |
| 2001/0016262 A1 | 8/2001 | Toyoshima |
| 2001/0030808 A1 | 10/2001 | Komatsu |
| 2002/0012779 A1 | 1/2002 | Miyashita |
| 2002/0014634 A1 | 2/2002 | Koyama |
| 2002/0016250 A1 | 2/2002 | Hayakawa |
| 2002/0028361 A1 | 3/2002 | Boire |
| 2002/0045073 A1 | 4/2002 | Finley |
| 2002/0046945 A1 | 4/2002 | Hosokawa |
| 2002/0071956 A1 | 6/2002 | Boire |
| 2002/0102352 A1 | 8/2002 | Hartig |
| 2002/0110638 A1 | 8/2002 | Boire |
| 2002/0119307 A1 | 8/2002 | Boire |
| 2002/0155265 A1 | 10/2002 | Choi |
| 2002/0155299 A1 | 10/2002 | Harris |
| 2002/0172775 A1 | 11/2002 | Buhay |
| 2002/0189938 A1 | 12/2002 | Baldwin |
| 2003/0038028 A1 | 2/2003 | Schultheis |
| 2003/0039843 A1 | 2/2003 | Johnson |
| 2003/0043464 A1 | 3/2003 | Dannenberg |
| 2003/0048538 A1 | 3/2003 | Tonar |
| 2003/0054177 A1 | 3/2003 | Jin |
| 2003/0064231 A1 | 4/2003 | Hurst |
| 2003/0096701 A1 | 5/2003 | Fujishima |
| 2003/0143437 A1 | 7/2003 | Ohtsu |
| 2003/0150712 A1 | 8/2003 | Reiter |
| 2003/0152780 A1 | 8/2003 | Baumann |
| 2003/0180547 A1 | 9/2003 | Buhay |
| 2003/0186089 A1 | 10/2003 | Kikuchi |
| 2003/0207028 A1 | 11/2003 | Boire |
| 2003/0215647 A1 | 11/2003 | Yoshida |
| 2003/0224620 A1 | 12/2003 | Kools |
| 2003/0235695 A1 | 12/2003 | Greenberg |
| 2003/0235720 A1 | 12/2003 | Athey |
| 2004/0005466 A1 | 1/2004 | Arai |
| 2004/0009356 A1 | 1/2004 | Medwick |
| 2004/0020761 A1 | 2/2004 | Thomsen |
| 2004/0032655 A1 | 2/2004 | Kikuchi |
| 2004/0043260 A1 | 3/2004 | Nadaud |
| 2004/0063320 A1 | 4/2004 | Hollars |
| 2004/0069623 A1 | 4/2004 | Vanderstraeten |
| 2004/0115362 A1 | 6/2004 | Hartig |
| 2004/0140198 A1 | 7/2004 | Cho |
| 2004/0146721 A1 | 7/2004 | Hartig |
| 2004/0149307 A1 | 8/2004 | Hartig |
| 2004/0163945 A1 | 8/2004 | Hartig |
| 2004/0179978 A1 | 9/2004 | Kobayashi |
| 2004/0180216 A1 | 9/2004 | Veerasamy |
| 2004/0180220 A1 | 9/2004 | Gueneau |
| 2004/0196580 A1 | 10/2004 | Nakaho |
| 2004/0202890 A1 | 10/2004 | Kutilek |
| 2004/0206024 A1 | 10/2004 | Graf |
| 2004/0214010 A1 | 10/2004 | Murata |
| 2004/0216487 A1 | 11/2004 | Boire |
| 2004/0241490 A1 | 12/2004 | Finley |
| 2004/0247901 A1 | 12/2004 | Suzuki |
| 2004/0248725 A1 | 12/2004 | Hiraoka |
| 2004/0253382 A1 | 12/2004 | De Bosscher |
| 2004/0253471 A1 | 12/2004 | Thiel |
| 2005/0003672 A1 | 1/2005 | Kools |
| 2005/0016835 A1 | 1/2005 | Krisko |
| 2005/0020444 A1 | 1/2005 | Hiraoka |
| 2005/0025982 A1 | 2/2005 | Krisko |
| 2005/0031876 A1 | 2/2005 | Lu |
| 2005/0042375 A1 | 2/2005 | Minami |
| 2005/0044894 A1 | 3/2005 | Nelson |
| 2005/0051422 A1 | 3/2005 | Rietzel |
| 2005/0084688 A1 | 4/2005 | Garrec |
| 2005/0106397 A1 | 5/2005 | Krisko |
| 2005/0137084 A1 | 6/2005 | Krisko |
| 2005/0138874 A1 | 6/2005 | O'Shaughnessy |
| 2005/0191505 A1 | 9/2005 | Akarsu |
| 2005/0191522 A1 | 9/2005 | Anzaki |
| 2005/0221098 A1 | 10/2005 | Azzopardi |
| 2005/0227008 A1 | 10/2005 | Okada |
| 2005/0233893 A1 | 10/2005 | Sakatani |
| 2005/0233899 A1 | 10/2005 | Anzaki |
| 2005/0238861 A1 | 10/2005 | Buhay |
| 2005/0244678 A1 | 11/2005 | Arfsten |
| 2005/0245382 A1 | 11/2005 | Iwahashi |
| 2005/0245383 A1 | 11/2005 | Iwahashi |
| 2005/0247555 A1 | 11/2005 | Thiel |
| 2005/0248824 A1 | 11/2005 | Fukazawa |
| 2005/0252108 A1 | 11/2005 | Sanderson |
| 2005/0258030 A1 | 11/2005 | Finley |
| 2005/0266248 A1 | 12/2005 | Millero |
| 2005/0272590 A1 | 12/2005 | Iwahashi |
| 2006/0000706 A1 | 1/2006 | Krisko |
| 2006/0003545 A1 | 1/2006 | Veerasamy |
| 2006/0011945 A1 | 1/2006 | Spitzer |
| 2006/0014027 A1 | 1/2006 | Oudard |
| 2006/0014050 A1 | 1/2006 | Gueneau |
| 2006/0019104 A1 | 1/2006 | Hurst |
| 2006/0029813 A1 | 2/2006 | Kutilek |
| 2006/0031681 A1 | 2/2006 | Smith |
| 2006/0032739 A1 | 2/2006 | Ikeda |
| 2006/0051597 A1 | 3/2006 | Anzaki |
| 2006/0055513 A1 | 3/2006 | French |
| 2006/0070869 A1 | 4/2006 | Krisko |
| 2006/0102465 A1 | 5/2006 | Blondeel |
| 2006/0107599 A1 | 5/2006 | Luten |
| 2006/0110605 A1 | 5/2006 | Luten |
| 2006/0118406 A1 | 6/2006 | Delahoy |
| 2006/0121315 A1 | 6/2006 | Myli |
| 2006/0127604 A1 | 6/2006 | Ikadai |
| 2006/0134322 A1 | 6/2006 | Harris |
| 2006/0134436 A1 | 6/2006 | Maschwitz |
| 2006/0141290 A1 | 6/2006 | Sheel |
| 2006/0152832 A1 | 7/2006 | Aumercier |
| 2006/0159906 A1 | 7/2006 | Messere |
| 2006/0165996 A1 | 7/2006 | Veerasamy |
| 2006/0194066 A1 | 8/2006 | Ye |
| 2006/0196765 A1 | 9/2006 | Cheng |
| 2006/0201203 A1 | 9/2006 | Labrousse |
| 2006/0210783 A1 | 9/2006 | Seder |
| 2006/0210810 A1 | 9/2006 | Harris |
| 2006/0225999 A1 | 10/2006 | Fukawa |
| 2006/0228476 A1 | 10/2006 | McCurdy |
| 2006/0234064 A1 | 10/2006 | Baubet |
| 2006/0247125 A1 | 11/2006 | Choi |
| 2006/0260938 A1 | 11/2006 | Petrach |
| 2006/0263610 A1 | 11/2006 | Greenberg |
| 2006/0275612 A1 | 12/2006 | Baubet |

(56) References Cited

U.S. PATENT DOCUMENTS

| | | |
|---|---|---|
| 2007/0025000 A1 | 2/2007 | Lin |
| 2007/0029187 A1 | 2/2007 | Krasnov |
| 2007/0029527 A1 | 2/2007 | Mills |
| 2007/0030569 A1 | 2/2007 | Lu |
| 2007/0031593 A1 | 2/2007 | Krasnov |
| 2007/0031681 A1 | 2/2007 | Anzaki |
| 2007/0031682 A1 | 2/2007 | Krasnov |
| 2007/0042893 A1 | 2/2007 | Koike |
| 2007/0065670 A1 | 3/2007 | Varaprasad |
| 2007/0077406 A1 | 4/2007 | Jacobs |
| 2007/0082124 A1 | 4/2007 | Hartig |
| 2007/0087187 A1 | 4/2007 | Lu |
| 2007/0092734 A1 | 4/2007 | Durandeau |
| 2007/0108043 A1 | 5/2007 | Lu |
| 2007/0109543 A1 | 5/2007 | Hoffman |
| 2007/0111012 A1 | 5/2007 | Rimmer |
| 2007/0116966 A1 | 5/2007 | Mellott |
| 2007/0116967 A1 | 5/2007 | Medwick |
| 2007/0129248 A1 | 6/2007 | Labrousse |
| 2007/0134501 A1 | 6/2007 | McMaster |
| 2007/0137673 A1 | 6/2007 | Boykin |
| 2007/0148064 A1 | 6/2007 | Labrousse |
| 2007/0184291 A1 | 8/2007 | Harris |
| 2007/0196563 A1 | 8/2007 | Wuwen |
| 2007/0218264 A1 | 9/2007 | Gueneau |
| 2007/0218265 A1 | 9/2007 | Harris |
| 2007/0218311 A1 | 9/2007 | O'Shaughnessy |
| 2007/0224357 A1 | 9/2007 | Buhay |
| 2007/0231501 A1 | 10/2007 | Finley |
| 2007/0237968 A1 | 10/2007 | Kijima |
| 2007/0254163 A1 | 11/2007 | Veerasamy |
| 2007/0254164 A1 | 11/2007 | Veerasamy |
| 2007/0264494 A1 | 11/2007 | Krisko |
| 2007/0275252 A1 | 11/2007 | Krasnov |
| 2007/0275253 A1 | 11/2007 | Thiel |
| 2008/0011408 A1 | 1/2008 | Maschwitz |
| 2008/0014349 A1 | 1/2008 | Otani |
| 2008/0026156 A1 | 1/2008 | Mehta |
| 2008/0026161 A1 | 1/2008 | Frings |
| 2008/0115471 A1 | 5/2008 | Labrousse |
| 2008/0119352 A1 | 5/2008 | Kitaguchi |
| 2008/0124460 A1 | 5/2008 | Athey |
| 2008/0188370 A1 | 8/2008 | Vormberg |
| 2008/0261056 A1 | 10/2008 | Labrousse |
| 2011/0165413 A1 | 7/2011 | Hartig |
| 2013/0220795 A1 | 8/2013 | Brabender |
| 2014/0061028 A1 | 3/2014 | Hartig |

FOREIGN PATENT DOCUMENTS

| | | |
|---|---|---|
| DE | 4313284 | 10/1994 |
| DE | 19736925 | 3/1998 |
| DE | 19644752 | 4/1998 |
| DE | 19831610 | 1/1999 |
| DE | 10100221 | 7/2001 |
| DE | 10100223 | 7/2001 |
| EP | 0157573 A2 | 10/1985 |
| EP | 0207646 | 1/1987 |
| EP | 0470379 | 2/1992 |
| EP | 0500774 | 2/1992 |
| EP | 0279550 | 4/1993 |
| EP | 0345045 | 10/1993 |
| EP | 0369581 | 12/1993 |
| EP | 0574119 | 12/1993 |
| EP | 0590477 | 4/1994 |
| EP | 0601928 | 6/1994 |
| EP | 0611733 | 8/1994 |
| EP | 0515847 | 2/1995 |
| EP | 0636702 | 2/1995 |
| EP | 0637572 | 2/1995 |
| EP | 0639655 | 2/1995 |
| EP | 0657562 | 6/1995 |
| EP | 0689096 | 12/1995 |
| EP | 0689962 | 1/1996 |
| EP | 0737513 | 10/1996 |
| EP | 0328257 | 4/1997 |
| EP | 0787696 | 8/1997 |
| EP | 0820967 | 1/1998 |
| EP | 0771766 | 9/1998 |
| EP | 0870530 | 10/1998 |
| EP | 0753882 | 11/1998 |
| EP | 0884288 | 12/1998 |
| EP | 0799255 | 2/1999 |
| EP | 0901991 | 3/1999 |
| EP | 0838535 | 2/2000 |
| EP | 0850203 | 1/2001 |
| EP | 1066878 | 1/2001 |
| EP | 0850204 | 12/2001 |
| EP | 1179515 | 2/2002 |
| EP | 0944557 | 11/2002 |
| EP | 1254870 | 11/2002 |
| EP | 0887104 | 11/2003 |
| EP | 1046727 | 11/2003 |
| EP | 1375444 | 1/2004 |
| EP | 1411386 | 4/2004 |
| EP | 1424083 | 6/2004 |
| EP | 1074525 | 9/2004 |
| EP | 1466665 | 10/2004 |
| EP | 1500634 | 1/2005 |
| EP | 1518836 | 3/2005 |
| EP | 1640149 | 3/2006 |
| EP | 0816466 | 5/2006 |
| EP | 1506143 | 5/2006 |
| EP | 1964821 | 9/2008 |
| FR | 2699164 | 2/1995 |
| FR | 2738812 | 3/1997 |
| FR | 2738813 | 3/1997 |
| FR | 2738836 | 3/1997 |
| FR | 2800731 | 5/2001 |
| FR | 2814094 | 3/2002 |
| FR | 2838734 | 10/2003 |
| FR | 2838735 | 10/2003 |
| FR | 2857885 | 1/2005 |
| FR | 2861385 | 4/2005 |
| FR | 2861386 | 4/2005 |
| FR | 2869897 | 11/2005 |
| FR | 2884147 | 10/2006 |
| GB | 0232680 | 4/1925 |
| GB | 1231280 | 5/1971 |
| GB | 1426906 | 3/1976 |
| GB | 1438462 | 6/1976 |
| GB | 2028376 | 3/1980 |
| GB | 1595061 | 8/1981 |
| GB | 2201428 | 2/1988 |
| GB | 2302102 | 1/1997 |
| GB | 2316687 | 8/1997 |
| GB | 2327428 | 7/1998 |
| JP | 57-140339 A | 8/1982 |
| JP | 60-081048 A | 5/1985 |
| JP | 61-091042 A | 5/1986 |
| JP | 62-161945 A | 7/1987 |
| JP | 01-014129 A | 1/1989 |
| JP | 01-118807 A | 5/1989 |
| JP | 3-122274 A | 5/1991 |
| JP | 3-187039 A | 8/1991 |
| JP | 3-193872 A | 8/1991 |
| JP | 4-276066 A | 10/1992 |
| JP | 5-214525 A | 8/1993 |
| JP | 5-253544 A | 10/1993 |
| JP | 6-330297 A | 11/1994 |
| JP | 7-149545 A | 6/1995 |
| JP | 7-215074 A | 8/1995 |
| JP | 7-233469 A | 9/1995 |
| JP | 7-508491 A | 9/1995 |
| JP | 7-315874 A | 12/1995 |
| JP | 7-315889 A | 12/1995 |
| JP | 8-011631 A | 1/1996 |
| JP | 8-012378 A | 1/1996 |
| JP | 8-109043 A | 4/1996 |
| JP | 8-134638 A | 5/1996 |
| JP | 8-158048 A | 6/1996 |
| JP | 8-227006 A | 9/1996 |
| JP | 9-189801 A | 7/1997 |
| JP | 9-202651 A | 8/1997 |

(56) References Cited

FOREIGN PATENT DOCUMENTS

| | | |
|---|---|---|
| JP | 9-249967 A | 9/1997 |
| JP | 10-36144 A | 2/1998 |
| JP | 10-048805 A | 2/1998 |
| JP | 10-140351 A | 5/1998 |
| JP | 10-278165 A | 10/1998 |
| JP | 11-09501 4 A | 4/1999 |
| JP | 11-1 94201 A | 7/1999 |
| JP | 11-180737 A | 7/1999 |
| JP | 11-302038 A | 11/1999 |
| JP | 2000-094569 | 4/2000 |
| JP | 2000-145310 | 5/2000 |
| JP | 2001-026858 | 1/2001 |
| JP | 2003-311157 | 11/2003 |
| JP | 2005-213585 | 8/2005 |
| JP | 2006-36631 | 2/2006 |
| JP | 2006-305527 | 11/2006 |
| KR | 10-2004-24582 | 3/2004 |
| WO | WO 87/06626 | 11/1987 |
| WO | WO 89/10430 | 11/1989 |
| WO | WO 92/17621 | 10/1992 |
| WO | WO 96/25534 | 8/1996 |
| WO | WO 97/03763 | 2/1997 |
| WO | WO 97/07066 | 2/1997 |
| WO | WO 97/07069 | 2/1997 |
| WO | WO 97/08359 | 3/1997 |
| WO | WO 97/10185 | 3/1997 |
| WO | WO 97/10186 | 3/1997 |
| WO | WO 97/11916 | 4/1997 |
| WO | WO 97/15499 | 5/1997 |
| WO | WO 97/25201 | 7/1997 |
| WO | WO 97/25450 | 7/1997 |
| WO | WO 97/37801 | 10/1997 |
| WO | WO 97/37946 | 10/1997 |
| WO | WO 99/11896 | 10/1997 |
| WO | WO 97/42351 | 11/1997 |
| WO | WO 97/42357 | 11/1997 |
| WO | WO 98/06675 | 2/1998 |
| WO | WO 98/23549 | 6/1998 |
| WO | WO 98/25700 | 6/1998 |
| WO | WO 99/44954 | 9/1999 |
| WO | WO 00/13257 | 3/2000 |
| WO | WO 00/15571 | 3/2000 |
| WO | WO 00/27771 | 5/2000 |
| WO | WO 00/37376 | 6/2000 |
| WO | WO 00/37377 | 6/2000 |
| WO | WO 00/40402 | 7/2000 |
| WO | WO 00/50354 | 8/2000 |
| WO | WO 00/75083 | 12/2000 |
| WO | WO 00/75087 | 12/2000 |
| WO | WO 01/02496 | 1/2001 |
| WO | WO 01/32578 | 5/2001 |
| WO | WO 01/68786 | 9/2001 |
| WO | WO 01/71055 | 9/2001 |
| WO | WO 02/04376 | 1/2002 |
| WO | WO 03/012540 | 2/2002 |
| WO | WO 02/22516 | 3/2002 |
| WO | WO 02/22517 | 3/2002 |
| WO | WO 02/24333 | 3/2002 |
| WO | WO 02/24971 | 3/2002 |
| WO | WO 02/40417 | 5/2002 |
| WO | WO 02/49980 | 6/2002 |
| WO | WO 02/085809 | 10/2002 |
| WO | WO 03/006393 | 1/2003 |
| WO | WO 03/009061 | 1/2003 |
| WO | WO 03/050056 | 6/2003 |
| WO | WO 03/053577 | 7/2003 |
| WO | WO 03/062166 | 7/2003 |
| WO | WO 03/068500 | 8/2003 |
| WO | WO 03/072849 | 9/2003 |
| WO | WO 03/080530 | 10/2003 |
| WO | WO 03/087002 | 10/2003 |
| WO | WO 03/087005 | 10/2003 |
| WO | WO 03/091471 | 11/2003 |
| WO | WO 03/093188 | 11/2003 |
| WO | WO 03/095385 | 11/2003 |
| WO | WO 03/095695 | 11/2003 |
| WO | WO 03/097549 | 11/2003 |
| WO | WO 03/106732 | 12/2003 |
| WO | WO 2004/013376 | 2/2004 |
| WO | WO 2004/034105 | 4/2004 |
| WO | WO 2004/061151 | 7/2004 |
| WO | WO 2004/067464 | 8/2004 |
| WO | WO 2004/085699 | 10/2004 |
| WO | WO 2004/085701 | 10/2004 |
| WO | WO 2004/086104 | 10/2004 |
| WO | WO 2004/087985 | 10/2004 |
| WO | WO 2004/089836 | 10/2004 |
| WO | WO 2004/089838 | 10/2004 |
| WO | WO 2004/089839 | 10/2004 |
| WO | WO 2004/092088 | 10/2004 |
| WO | WO 2004/092089 | 10/2004 |
| WO | WO 2004/097063 | 11/2004 |
| WO | WO 2004/108618 | 12/2004 |
| WO | WO 2004/108619 | 12/2004 |
| WO | WO 2004/108846 | 12/2004 |
| WO | WO 2004/113064 | 12/2004 |
| WO | WO 2005/000758 | 1/2005 |
| WO | WO 2005/000759 | 1/2005 |
| WO | WO 2005/005337 | 1/2005 |
| WO | WO 2005/007286 | 1/2005 |
| WO | WO 2005/009914 | 2/2005 |
| WO | WO 2005/012593 | 2/2005 |
| WO | WO 2005/023723 | 3/2005 |
| WO | WO 2005/040056 | 5/2005 |
| WO | WO 2005/040058 | 5/2005 |
| WO | WO 2005/063646 | 7/2005 |
| WO | WO 2005/102952 | 11/2005 |
| WO | WO 2005/102953 | 11/2005 |
| WO | WO 2005/110937 | 11/2005 |
| WO | WO 2005/111257 | 11/2005 |
| WO | WO 2006/004169 | 1/2006 |
| WO | WO 2006/007062 | 1/2006 |
| WO | WO 2006/017311 | 2/2006 |
| WO | WO 2006/017349 | 2/2006 |
| WO | WO 2006/019995 | 2/2006 |
| WO | WO 2006/020477 | 2/2006 |
| WO | WO 2006/028729 | 3/2006 |
| WO | WO 2006/036605 | 4/2006 |
| WO | WO 2006/054954 | 5/2006 |
| WO | WO 2006/055513 | 5/2006 |
| WO | WO 2006/057830 | 6/2006 |
| WO | WO 2006/062902 | 6/2006 |
| WO | WO 2006/064059 | 6/2006 |
| WO | WO 2006/064060 | 6/2006 |
| WO | WO 2006/066101 | 6/2006 |
| WO | 2006070623 A1 | 7/2006 |
| WO | WO 2006/077839 | 7/2006 |
| WO | WO 2006/089964 | 8/2006 |
| WO | WO 2006/101994 | 9/2006 |
| WO | WO 2006/108985 | 10/2006 |
| WO | WO 2006/117345 | 11/2006 |
| WO | WO 2006/134335 | 12/2006 |
| WO | WO 2007/016127 | 2/2007 |
| WO | WO 2007/018974 | 2/2007 |
| WO | WO 2007/018975 | 2/2007 |
| WO | WO 2007/045805 | 4/2007 |
| WO | WO 2007/080428 | 7/2007 |
| WO | WO 2007/092511 | 8/2007 |
| WO | WO 2007/093823 | 8/2007 |
| WO | WO 2007/096461 | 8/2007 |
| WO | WO 2007/110482 | 10/2007 |
| WO | WO 2007/121211 | 10/2007 |
| WO | WO 2007/121215 | 10/2007 |
| WO | WO 2007/127060 | 11/2007 |
| WO | WO 2007/130140 | 11/2007 |
| WO | WO 2008/063774 | 5/2008 |

OTHER PUBLICATIONS

Anderson et al., Improved Photocatalytic Activity and Characterization of Mixed $TiO_2/SiO_2$ and $TiO_2/Al_2O_3$ Materials, J. Phys. Chem., vol. 101 (1997) pp. 2611-2616.

(56) References Cited

OTHER PUBLICATIONS

Ang et al., Deposition of High Stability Thin Film Ternary Alloy Resistors by Sputtering, In: International conf. on Vacuum Metallurgy, 4th, Jun. 4-8, 1973, 6 pages, Tokyo, Japan.
Becker et al., Production and Properties of Plate Glasses Coated by Means of High-Vacuum Sputtering Processes, Magazine Silikattechnik. vol. 36, Issue 5 (1985) 12 pages with English translation.
Bell et al., Electrochromism in Sol-Gel Deposited $TiO_2$ films, Proceedings of the SPIE, vol. 2255 (1994) pp. 324-331.
Brat et al., The Influence of Tungsten-10Wt% Titanium Sputtering Target Purity and Density on VLSI Applications, Proceedings of the 2nd ASM International™ Electronic Materials and Processing Congress, Apr. 24-28, 1989, 10 pages, Philadelphia, PA.
Chen et al, the Effect of $SiO_2$ Additive on Super-hydrophilic Property of $TiO_2$-$SiO_2$ Thin Film by Sol-gel Method, Journal of Wuhan University of Technology-Mater. Sci. Ed., vol. 16, Sep. 2001, No. 3, pp. 30-33.
Creighton, Non-Selective Tungsten CVD Using Tungsten Hezxacarbonyl, (1987) 12 pages, Sandia National Laboratories, Albuquerque, NM.
De Tacconi et al., Nanoporous $TiO_2$ and $WO_3$ Films by Anodization of Titanium and Tungsten Substrates: Influence of process Variables on Morphology and Photoelectrochemical Response, J. Phys. Chem. B, vol. 110 (2006) pp. 25347-25355.
Definition of Engineer, retrieved from the Internet [http://www.meriam-webster.com/dictionary/engineered] on Apr. 18, 2013, no author.
Diesburg et al., Low Mobile Ion Contamination From Sputtered High Purity Tungsten, 12th International Plansee Seminar, vol. 3 (1989) pp. 371-378, Reutte, Tirol, Austria.
Duley, Refractive Indices for Amorphous Carbon, The Astrophysical Journal, vol. 287, Dec. 15, 1984, pp. 694-696.
Enesca et al., Novel Approach of $TiO_2$/WO3 for Water Splitting, 20th European Photovoltaic Solar Energy Conference, Jun. 6-10, 2005, pp. 262-265, Barcelona, Spain.
English abstract of DE 10100221, retrieved from the European Patent Office online database Espacenet [http://worldwide.espacenet.com/publication Details/biblio?DB=EPODOC&II=0 &ND=3&adjacent . . . ] on May 15, 2015, 1 page.
English abstract of DE 19644752, retrieved from the European Patent Office online database Espacenet [http://worldwide.espacenet.com/publication Details/biblio?DB=EPODOC&II=0 &ND=3&adjacent . . . ] on May 15, 2015, 2 pages.
English abstract of DE 19736925, retrieved from the European Patent Office online database Espacenet [http://worldwide.espacenet.com/publication Details/biblio?DB=EPODOC&II=0 &ND=3&adjacent . . . ] on May 15, 2015, 2 pages.
English abstract of DE 19831610, retrieved from the European Patent Office online database Espacenet [http://worldwide.espacenet.com/publication Details/biblio?DB=EPODOC&II=0 &ND=3&adjacent . . . ] on May 15, 2015, 1 page.
English abstract of DE 4313284, retrieved from the European Patent Office online database Espacenet [http://worldwide.espacenet.com/publication Details/biblio?DB=EPODOC&II=0&ND= 3&adjacent . . . ] on May 15, 2015, 1 page.
English abstract of DE10100223, retrieved from the European Patent Office online database Espacenet [http://worldwide.espacenet.com/publication Details/biblio?DB=EPODOC&II=0 &ND=3&adjacent . . . ] on May 18, 2015, 2 pages.
English abstract of FR 2738836, retrieved from the European Patent Office online database Espacenet [http://v3.espacenet.com/textdoc?DB= EPODOC&IDX=FR2738836&F=0] on Oct. 8, 2007, 1 page.
English abstract of FR 2800731, retrieved from the European Patent Office online database Espacenet [http://worldwide.espacenet.com/publication Details/biblio?DB=EPODOC&II=0&ND= 3&adjacent . . . ] on May 15, 2015, 1 page.
English abstract of FR 2814094, retrieved from the European Patent Office online database Espacenet [http://worldwide.espacenet.com/publication Details/biblio?DB=EPODOC&II=0&ND= 3&adjacent . . . ] on May 15, 2015, 2 pages.
English abstract of FR 2838734, retrieved from the European Patent Office online database Espacenet [http://worldwide.espacenet.com/publication Details/biblio?DB=EPODOC&II=0&ND= 3&adjacent . . . ] on May 15, 2015, 2 pages.
English abstract of FR 2838735, retrieved from the European Patent Office online database Espacenet [http://worldwide.espacenet.com/publication Details/biblio?DB=EPODOC&II=0&ND= 3&adjacent . . . ] on May 15, 2015, 2 pages.
English abstract of FR 2857885, retrieved from the European Patent Office online database Espacenet [http://worldwide.espacenet.com/publication Details/biblio?DB=EPODOC&II=0&ND= 3&adjacent . . . ] on May 15, 2015, 1 page.
English abstract of FR 2861385, retrieved from the European Patent Office online database Espacenet [http://worldwide.espacenet.com/publication Details/biblio?DB=EPODOC&II=0&ND= 3&adjacent . . . ] on May 15, 2015, 1 page.
English abstract of FR 2861386, retrieved from the European Patent Office online database Espacenet [http://worldwide.espacenet.com/publicationDetails/biblio?DB=EPODOC&II=0&ND= 3&adjacent . . . ] on May 15, 2015, 1 page.
English abstract of FR 2869897, retrieved from the European Patent Office online database Espacenet [http://worldwide.espacenet.com/publication Details/biblio?DB=EPODOC&II=0&ND= 3&adjacent . . . ] on May 15, 2015, 1 page.
English abstract of FR 2884147, retrieved from the European Patent Office online database Espacenet [http://worldwide.espacenet.com/publication Details/biblio?Adjacent=true&KC=A1 &date=200610113&N . . . ] on Feb. 12, 2009, 1 page.
English abstract of JP 01-014129, retrieved from the Japan Patent Office online database Japan Platform for Patent Information [https://www4.j-platpatinpit.go.jp/eng/tokujitsu/tkbs_en/TKBS_EN_GM301_Detailed.action] on May 15, 2015, 1 page.
English abstract of JP 01-118807, retrieved from the Japan Patent Office online database Japan Platform for Patent Information [https://www4.j-platpatinpit.go.jp/eng/tokujitsu/tkbs_en/TKBS_EN_GM301_Detailed.action] on May 15, 2015, 1 page.
English abstract of JP 10-048805, retrieved from Japan Patent Office online database Japan Platform for Patent Information [https://www19.jplatpat.inpit.go.jp/PA1/cgibin/PA1TKDLINK?key_code=TKD&number=H1004 . . . ] on May 15, 2015, 1 page.
English abstract of JP 10-278165, retrieved from Japan Patent Office online database Japan Platform for Patent Information [https://www19.jplatpat.inpit.go.jp/PA1/cgibin/PA1TKDLINK?key_code=TKD&number=H1027 . . . ] on May 15, 2015, 1 page.
English abstract of JP 11-095014, retrieved from Japan Patent Office online database Japan Platform for Patent Information [https://www19.jplatpat.inpit.go.jp/PA1/cgibin/PA1TKDLINK?key_code=TKD&number= H1109 . . . ] on May 15, 2015, 1 page.
English abstract of JP 11-180737, retrieved from Japan Patent Office online database Japan Platform for Patent Information [https://www4.jplatpatinpit.go.jp/eng/tokujitsu/tkbs_en/TKBS_EN_GM301_Detailed.action] on May 15, 2015, 1 page.
English abstract of JP 11-302038, retrieved from Japan Patent Office online database Japan Platform for Patent Information [https://www19.jplatpat.inpit.go.jp/PA1/cgibin/PA1TKDLINK?key_code=TKD&number=H1130 . . . ] on May 15, 2015, 1 page.
English abstract of JP 2000-094569, retrieved from the European Patent Office online database Espacenet [http:v3.espacenet.com/textdoc?DB=EPODOC& IDX= JP2000094569&F=0] on Oct. 8, 2007, 1 page.
English abstract of JP 2003-311157, retrieved from Japan Platform for Patent Information [https://www19.jplatpat.inpit.go.jp/PA1/cgibin/PA1TKDLINK?key_code=TKD&number=20033 . . . ] on May 15, 2015, 1 page.
English abstract of JP 2005-213585, retrieved from Japan Patent Office online database Japan Platform for Patent Information [http://worldwide.espacenet.com/publicationDetails/biblio?DB=EPODOC&II=0&ND= 3&adjacent . . . ] on May 15, 2015, 2 pages.

(56) References Cited

OTHER PUBLICATIONS

English abstract of JP 2006-305527, retrieved from the European Patent Office online database Espacenet [http:v3.espacenet.com/textdoc?DB=EPODOC&IDX=JP2006305527 F=] on Dec. 6, 2007, 1 page.
English abstract of JPS 57-140339, retrieved from the European Patent Office online database Espacenet [http://worldwide.espacenet.com/publication Details/biblio?DB=worldwide.espacenet.com&II=1& . . . ] on May 19, 2015, 1 page.
English abstract of JPS 60-081048, retrieved from the European Patent Office online database Espacenet [http://worldwide.espacenet.com/publicationDetails/biblio?DB=EPODOC&II=0 &ND=3&adjacent . . . ] on May 19, 2015, 2 pages.
English abstract of JPS 61-091042, retrieved from the European Patent Office online database Espacenet [http://worldwide.espacenet.com/publicationDetails/biblio?DB=EPODOC&II=0 &ND=3&adjacent . . . ] on May 19, 2015, 2 pages.
English abstract of JPS 62-161945, retrieved from the European Patent Office online database Espacenet [http://worldwide.espacenet.com/publicationDetails/biblio?DB=EPODOC&II=0 &ND=3&adjacent . . . ] on May 19, 2015, 2 pages.
English Abstract of WO 2000/040402, retrieved from the European Patent Office online database Espacenet [http://worldwide.espacenet.com/publicationDetails/biblio?DB=EPODOC&II=0 &ND=3&adjacent . . . ] on May 15, 2015, 2 pages.
English abstract of WO 2001/068786, retrieved from the European Patent Office online database Espacenet [http://v3.espacenet.com/publication Details/biblio?adjacent=true&KC=A1 &date=20010920&N . . . ] on Feb. 12, 2009, 1 page.
English abstract of WO 2004/0113064, retrieved from the European Patent Office online database Espacenet [http://worldwide.espacenet.com/publicationDetails/biblio?DB=EPODOC&II=O &ND=3&adjacent . . . ] on May 19, 2015, 2 pages.
English abstract of WO 2004/086104, retrieved from the European Patent Office online database Espacenet [http://worldwide.espacenet.com/publication Details/biblio?DB=EPODOC&II=0 &ND=3&adjacent . . . ] on May 19, 2015, 2 pages.
English abstract of WO 2005/102952, retrieved from the European Patent Office online database Espacenet [http:v3.espacenet.com/textdoc?DB= EPODOC&IDX= W02005102952&F=0] on Oct. 11, 2007, 1 page.
English abstract of WO 2006/089964, retrieved from the European Patent Office online database Espacenet [http://worldwide.espacenet.com/publication Details/biblio?DB=EPODOC&II=0 &ND=3&adjacent . . . ] on May 19, 2015, 1 page.
English abstract of WO 2006/108985, retrieved from the European Patent Office online database Espacenet [http://worldwide.espacenet.com/publication Details/biblio?DB=EPODOC&II=0 &ND=3&adjacent . . . ] on May 19, 2015, 2 pages.
English abstract of WO 2007/045805, retrieved from the European Patent Office online database Espacenet [http://worldwide.espacenet.com/publication Details/biblio?DB=EPODOC&II=0 &ND=3&adjacent . . . ] on May 19, 2015, 2 pages.
English abstract of WO2006/077839, retrieved from the European Patent Office online database Espacenet [http://v3.espacenet.com/publication Details/biblio?CC=WO&NR=2006077839A1 &KC=A1&F . . . ] on Feb. 12, 2009, 1 page.
English translation of DE 3906453, retrieved from Google [https://www.google.com/patents/ DE3906453A1?cl=en&dq=DE3906453 &hl=en&sa=X&ei=2B9 . . . ] on May 15, 2015, 5 pages.
Gao et al., Great Enhancement of Photocatalytic Activity of Nitrogen-Doped Titania by Coupling with Tungsten Ozxide, J. Phys. Chem. B, vol. 110 (2006), pp. 14391-14397.
Glaser, Coating of Large Glass Panes by Cathode Sputtering Glastechn Ber., vol., 56, No. 9, (1983) 33 pages with English-language translation.
Göttsche et al., Electrochromic Mixed Wo3- $TiO_2$ thin Films Produced by sputtering and the Sol-Gel Technique: a Comparison, Solar Energy Materials and Solar Cells, vol. 31 (1993) pp. 415-428.

Guan et al, Enhanced Effect and Mechanism of $SiO_2$ Addition in Super-Hydrophilic Property of $TiO_2$ Films, Surf and Coating Tech, vol. 173 (2003) pp. 219-223.
Guan, Hydrophilic Property of $TiO_2/SiO_2$ Mixing Films, Trans. Nonferrous Met. Soc. China, vol. 14 (2004) No. 2, pp. 251-254.
Guan, Relationship Between Photocatalytic Activity, Hydrophilicity and Self-Cleaning Effect of $TiO_2/SiO_2$ Films, Surf and Coating Tech, vol. 191 (2005) pp. 155-160.
Gusev et al., Sputtering of Tungsten, Tungsten Oxide, and Tungsten-Carbon Mixed Layers by Deuterium Ions in the Threshold Energy Region, Tech Phys., vol. 44 (9), Sep. 1999, pp. 1123-1127.
Hamelmann et al., Metal Oxide/Silicon Oxide Multilayer With Smooth Interfaces Produced by in Situ Controlled Plasma-Enhanced MOCVD, Thin Solid Films, vol. 358 (2000), pp. 90-93.
Hashimoto et al., Lifetime of Electrochromism of Amorphous W03-$TiO_2$ thin Films, J. Electrochem. Soc., vol. 138, No. 8, Aug. 1991, pp. 2403-2408.
Herrera et al., Synthesis, Characterization, and Catalytic Function of Novel Highly Dispersed Tungsten Oxide Catalysts on Mesoporous Silica J. Catalysis, vol. 239 (2006), pp. 200-211.
Higashimoto et al., Photoelectrochemical Properties of Hybrid WO3TiO2 Electrode. Effect of Structures of W03 on Charge Separation, Thin Solid Films, vol. 503 (2006), pp. 201-206.
Hill et al., Coated Glass Application and Markets, Chapter 1—History of Glass Coating, pp. 1-4, Chapter 6—Future Directions, (1999) pp. 90-94, BOC Coating Technology, Fairfield, CA.
Hodgson et al., Photocatalytic Reactor Systems with Tungsten Oxide-Modified Titanium Dioxide for Indoor Air Applications, 11th Conference on $TiO_2$ Photocatalysis: Fundamentals & Applications, Sep. 25-28, 2006, Pittsburgh, PA.
Ingo et al., XPS Studies of $SiO_{2\text{-}TiO2}$ Powders Prepared by Sol-Gel Process, Appl. Surf Sci., vol. 70/71A (1993) pp. 230-234.
International Preliminary Report on Patentability, dated Oct. 22, 2008 for PCT Application No. PCT/US2007/066685, 7 pages.
International Search Report and Written Opinion, dated Jan. 9, 2009 for PCT Application No. PCT/US2008/076183, 9 pages.
International Search Report and Written Opinion, dated Jan. 22, 2008 for PCT Application No. PCT/US2007/073010, 8 pages.
International Search Report and Written Opinion, dated Apr. 17, 2009 for PCT Application No. PCT/US2008/076157, 14 pages.
Irie et al., Interfacial Structure Dependence of Layered $TiO_2$/Wo3 Thin Films on the Photoinduced Hydrophilic Property, Vacuum, vol. 74 (2004), pp. 625-629.
Jossen et al., Thermal Stability and Catalytic Activity of Flame-Made Silica-Vanadia-Tungsten Oxide-Titania, App. Catalysis B: Environmental, vol. 69 (2007), pp. 181-188.
Kanou, Application of High Purity W for VLSI Sputtering Targets, $7^{th}$ International Tungsten Symposium, Sep. 1996, pp. 410-418.
Katsumata et al., Effect of Microstructure on Photoinduced Hydrophilicity of Transparent Anatase Thin Films, Surface Science, vol. 579 (2005) pp. 123-130.
Keller et al., Photocatalytic Oxidation of Butyl Acetate in Vapor Phase on $TiO_2$, $Pt/TiO_2$ and $WO_3/TiO_2$ Catalysts, Journal of Catalysis, vol. 215 (2003), pp. 129-138.
Kienel, Vacuum Coating, 5 Anwendungen Teil II, VDI Verlag (1993) ISBN 3-18-401315-4, 41 pages with English translation.
Kienel, Vacuum Coating, 5 Anwendungen Teil II, VDI Verlag (1993) ISBN 3-18-401313-8, 9 pages with English translation.
Kobayashi et al., $V_2O_5$-$WO_3/TiO_2$-$SiO_2$-$SO_4^{2-}$ Catalysts: Influence of Active Components and Supports on Activities in the Selective Catalytic Reduction of NO By $NH_3$ and in the Oxidation of $SO_2$, App. Cat. B: Enviro., Vol. 63 (2006), pp. 104-113.
Lassaletta et al., Spectroscopic Characterization of Quantum-Sized $TiO_2$ Supported on Silica: Influence of Size and TiO2-Si02 Interface Composition, J. Phys. Chem., vol. 99, (1995) pp. 484-1490.
Lo et al., Influence of Target Structure on Film Stress in WTI Sputtering, Mat. Res. Soc. Symposium Proceedings, vol. 505, (1998) pp. 427-432, Boston, MA.
Martin, Ion-Based Methods for Optical Thin Film Deposition, Journal of Material Science, vol. 21 (1986) pp. 1-25.
Matthews et al., an Adsorption Water Purifier with in Situ Photocatalytic Regeneration, J. Catal., vol. 113 (1988) pp. 549-555.

(56) References Cited

OTHER PUBLICATIONS

MikroElektronik, High-rate Sputtering System for Two-Sided Coating (HZS-04), VEB Elektromat Dresden, (1986) pp. 1-30.
Minero et al., Role of Adsorption in Photocatalyzed Reactions of Organic Molecules in Aqueous of $TiO_2$ Suspensions, Langmuir, vol. 113 (1992) pp. 481-486.
Miyashita et al., Spectrum Response of the Vacuum-Deposited $SiO_2/TiO_2$ Multilayer Film with Improved Photo-catalytic activity, Journal of Materials Science Letters, vol. 20 (2001) pp. 2137-2140.
Miyashita, et al., Enhanced Effect of Vacuum-Deposited $SiO_2$ Overlayer on Photo-induced Hydrophilicity of $TiO_2$ Film, Journal of Materials Science vol. 36 (2001) pp. 3877-3884.
Miyauchi et al., A Highly Hydrophilic Thin Film Under 1 μ $W/cm^2$ UV Illumination, Adv. Mater., vol. 12 (2000) pp. 1923-1927.
Nakamura, et al., Hydrophilic Property of $SiO_2/TiO_2$ Double Layer Films, Panel Session: Photocatalytic Coatings, 5th International Conference on Coatings on Glass (2004) pp. 345-350, Saarbruecken, Germany.
Niwa et al., Ammoxidation of Toluene Over $SiO_2$-$AL_2O_3ZrO_2$-$SiO_2$and $TiO_2$-$SiO_2$, J. Catal., vol. 69 (1981) pp. 69-76.
Novotna, et al., Photocatalytical $TiO_2/$ $SiO_2$ — PDMS Layers on Glass, Panel Session: Photocatalytic Coatings, 5th International Conference on Coatings on Glass (2004) pp. 383-387.
O'Bannon, Dictionary of Ceramic Science and Engineering (1984) pp. 12 & 117.
Obee et al., A Kinetic Study of Photocatalytic Oxidation of VOCs on $WO_3$ Coated Titanium Dioxide, 11th Conference on $TiO_2$ Photocatalysis: Fundamentals & Applications, Sep. 25-28, 2006, 1 page, Pittsburgh, PA.
Ohsaki, et al., Photocatalytic Properties of $SnO_2/TiO_2$ Multilayers, Panel Session: Photocatalytic Coatings, 5th International Conference on Coatings on Glass (2004) pp. 369-376, Saarbruecken, Germany.
Okimura et al., Characteristics of Rutile $TiO2$ Films Prepared by R.F. Magnetron Sputtering at a Low Temperature, Thin Solid Films, vol. 281-282 (1996) pp. 427-430.
Quotation Specification for a Single-Ended In-Line Vacuum Coating System to Process Glass Substrates, Prepared by Airco Coating Technology, dated Aug. 17, 1988, 19 pages.
Ramana et al., Structural Stability and Phase Transitions in $WO_3$ Thin Films, J. Phys Chem. B (2006), pp. 10430-10435.
Ramirez-Del-Solar et al., Effect of the Method of Preparation on the Texture of $TiO_2$-$SiO_2$ Gels, J. Non-Cryst. Solids, vol. 121 (1990) pp. 84-89.
Richardson et al., Tungsten-Vanadium Oxide Sputtered Films for Electrochromic Devices, Electrochemical Society: Molecular Functions of Electroactive Thin Films Conference, Boston, MA, Nov. 1988, 12 pages retrieved online from Berkeley Lab [http://btech.lbl.gov/publications/tungsten-vanadium-oxide-sputtered-fil].
Saeki et al., The Photoelectrochemical Response of $TiO_2$- Wo3 Mixed Oxide Films Prepared by Thermal Oxidation of Titanium Coated with Tungsten, J. Electrochem. Soc., vol. 143, Jul. 1996, No. 7, pp. 2226-2229.
Salvado et al., $TiO_2$- $SiO_2$ Glasses Prepared by the Alkoxide Route, J. Non-Cryst. Solids, vol. 147/148 (1992) pp. 256-261.
Satoh et al., Sol-gel-derived Binary Silica Glasses with High Refractive Index, J. Non-Cryst. Solids, vol. 146 (1992) pp. 121-128.
Schiller et al., Influence of Deposition Parameters on the Optical and Structural Properties of $TiO_2$ Films Produced by Reactive D.C. Plasmetron Sputtering, Thin Solid Films, vol. 83 (1981) pp. 239-245.
Schintlmeister et al., Optical Coatings (nb2O5, Ta2O5 and WO3) for Lac-Applications Obtained by DC Quasireactive Magnetron Sputtering of Ceramic Sputtering Targets, 46th Annual Technical Conference Proceedings-Soc. of Vacuum Coaters, May 3-8, 2003, pp. 296-301, San Francisco, CA.
Schraml-Marth et al., Porous Silica Gels and $TiO_2$- $SiO_2$ Mixed Oxides Prepared Via the Sol-Gel Process: Characterization by Spectroscopic Techniques, J. Non-Cryst. Solids (1992) vol. 143, pp. 93-111.

Schwarz et al., Thermal Material Spraying — An Alternative Technique for the Production of Special Purpose Sputtering Targets with English abstract, Thermal Spraying Conference (1996) 5 pages.
Shen et al., A New Method to Prepare Tungsten and Nitrogen Co-Doped Titanium Dioxide and its Excellent Photocatalytic Activities Irradiated by Visible Light, 11th Conference on $TiO_2$ Photocatalysis: Fundamentals & Applications, Sep. 25-28, 2006, 1 page, Pittsburgh, PA.
Shibata, K., et al., Acidic Properties of Binary Metal Oxides, Bull. Chem. Soc. Jpn., vol. 46 (1973) pp. 2985-2988.
Shiyanovskaya et al., Biocomponent WO3/ $TiO_2$ Films as Photoelectrodes, J. Electrochemical Soc., vol. 146 (1999) pp. 243-249.
Sinel'Nikova et al., Interaction of a Mixture of Oxides of Tungsten and Silicon With Carbon, Soviet Powder Metallurgy and Metal Ceramics, vol. 29, Mar. 1990, No. 3(327), pp. 234-236.
Song et al., Efficient Degradation of Organic Pollutant with Wox Modified Nano $TiO_2$ Under Visible Irradiation, J. of Photochemistry and Photobiology A: Chemistry, vol. 181 (2006) pp. 421-428.
Staffler et al, Advanced Coating Technology Based Upon Sputtering Targets Produced by Powder Metallurgy, Horizons of Powder Metallurgy Part I, Proceedings of the 1986 International Powder Metallurgy Conference and Exhibition, Jul. 7-11, 1986, pp. 219-222, Dusseldorf, Germany.
Stakheev, et al., XPS and XAES Study of $TiO_2$- SiO2 Mixed Oxide System, J. Phys. Chem., vol. 97 (1993) pp. 5668-5672.
Stankova et al., Thin (0 0 1) Tungsten Trioxide Films Grown by Laser Deposition, App. Surface Science, vol. 247 (2005) pp. 401-405.
Stella, EPMA Analysis of Float Glass Surfaces, Mikorchimica Acta, vol. 114-115, Dec. 1994, Issue 1, pp. 475-480.
Stumpp et al, Manufacturing of Superclean Refractory and Reactive Metals and Alloys in High Vacuum for Advanced Technologies, 8th ICVM: Special Melting/Refining and Metallurgical Coating Under Vacuum or Controlled Atmosphere, vol. 2, Sep. 1985, pp. 1310-1324.
Su et al., All Solid-State Smart Window of Electrodeposited WO3 and $TiO_2$ Particulate Film With PTREFG Gel Electrolyte, J. Phys Chem. Solids, vol. 59 (1998) No. 8, pp. 1175-1180.
Surface Hardening of Ceramic and Glass Materials, IBM Technical Disclosure Bulletin, vol. 36, Jan. 1993, Issue 1, p. 225.
Surface Hardening of Ceramic and Glass Materials, IBM Technical Disclosure Bulletin, vol. 36, Mar. 1993, Issue 3, pp. 291-292.
Szczyrbowski et al., Properties of $TiO_2$- Layers Prepared by Medium Frequency and DC Reactive Sputtering, 1997 Soc. of Vacuum Coaters (1997), pp. 237-241.
Tada et al., Deactivation of the $TiO_2$ Photocatalyst by Coupling with WO3 and the Electrochemically Assisted High Photocatalytic Activity of WO3, Langmuir, vol. 20 (2004) pp. 4665-4670.
Takeuchi, et al., Preparation of Titanium-Silicon Binary Oxide Thin Film Photocatalysts by an Ionized Cluster Beam Deposition Method. Their Photocatalytic Activity and Photoinduced Super-Hydrophilicity, J. Phys. Chem., vol. 107 (2003) pp. 14278-14282.
U.S. Appl. No. 09/572,766, Carbon-based Soil-resistant Coating for Glass Surfaces, filed May 17, 2000, 30 pages.
Veersamy, et al., Optical and Electronic Properties of Amorphous Diamond, Diamond and Related Materials, vol. 2 (1993), pp. 782-787.
Von Ardenne et al., the Effects of Physics and Their Applications, Verlag Harri Deutsch, Thun and Frankfurt am Main, (1997) 11 pages with English abstract.
Wachs et al., Catalysis Science of the Solid Acidity of Model Supported Tungsten Oxide Catalysts, Catalysis Today, vol. 116 (2006), pp. 162-168.
Wilhartitz et al., 3D-Sims Analysis of Ultra High Purity Molybdenum and Tungsten: A Characterization of Different Manufacturing Techniques, Fresenius J Anal Chem., vol. 353 (1995) pp. 524-532.
Yamamoto et al., Characteristics of Tungsten Gate Devices for Mos VLSI's, Materials Research Society, (1986) pp. 297-311.
Yamamoto et al., Fabrication of Highly Reliable Tungsten Gate MOS VLSI's, J. Electrochem. Soc., vol. 133 Feb. 1986, No. 2, pp. 401-407.

(56) References Cited

OTHER PUBLICATIONS

Yamauchi et al., Development of W-Ti Binary Alloy Sputtering Target and Study of its sputtering Characteristics, Nippon Tungsten Review, vol. 22 (1989), pp. 55-72.
Yoo et al., Effects of Annealing Temperature and Method on Structural and Optical Properties of TiO2 Films prepared by Rf Magnetron Sputtering at Room Temperature, App. Surface Science, vol. 253 (2007), pp. 3888-3892.
Yoon et al., Growth Kinetics and Oxidation Behavior of WSi2 Coating Formed by Chemical Vapor Deposition of Si on W Substrate, J. Alloys and Compounds, vol. 420 (2006) pp. 199-206.
Yu et al., the Grain Size and Surface Hydroxyl Content of Super-hydrophilic $TiO_2$- $SiO_2$ Composite Nanometer Thin Films J. Mat. Sci. Lett., vol. 20 (2001) pp. 1745-1748.
Zanhai et al., Preparation of W-Ti Sputtering Targets under Inert Atmosphere, Chinese Journal of Rare Metals, vol. 30, (2006) No. 5, 7 pages with English abstract.
Zanhai et al., Tungsten-Titanium Targets and Manufacturing Technology, Chinese Journal of Rare Metals, vol. 30 (2006) No. 1, 6 pp. with English abstract.
Zemen et al., Self-cleaning and Antifogging Effects of $TiO_2$Films Prepared by Radio Frequency Magnetron Sputtering, J. Vac. Sci. Technol. A, Mar./Apr. 2002, pp. 388-393.

\* cited by examiner

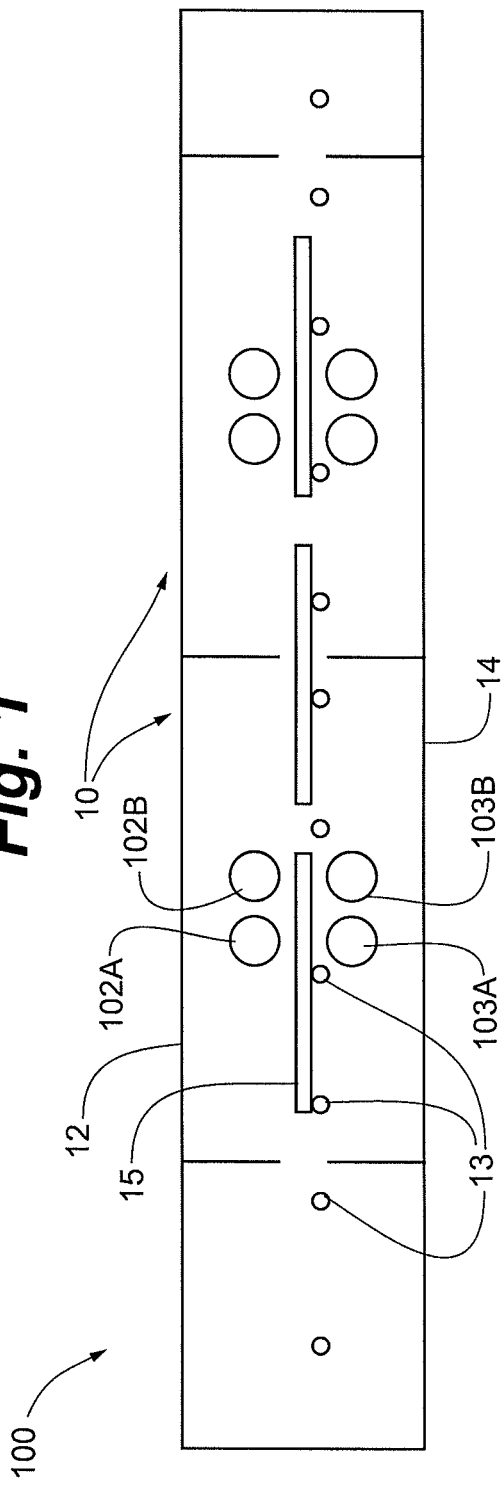

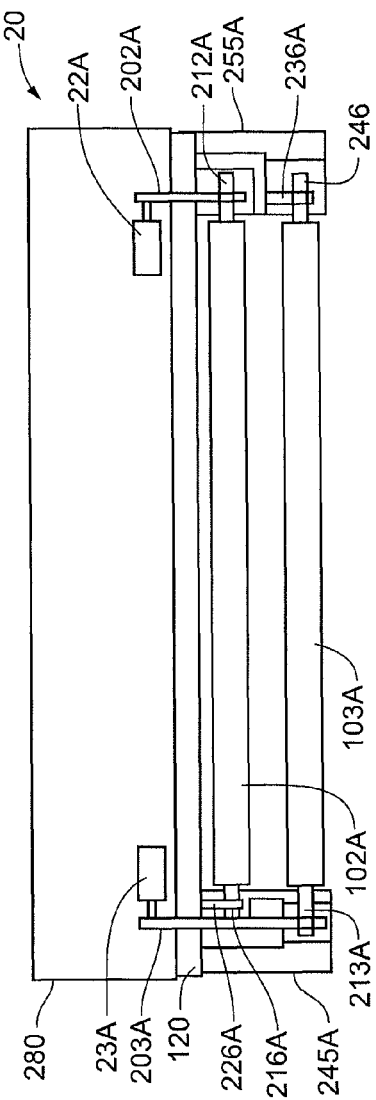
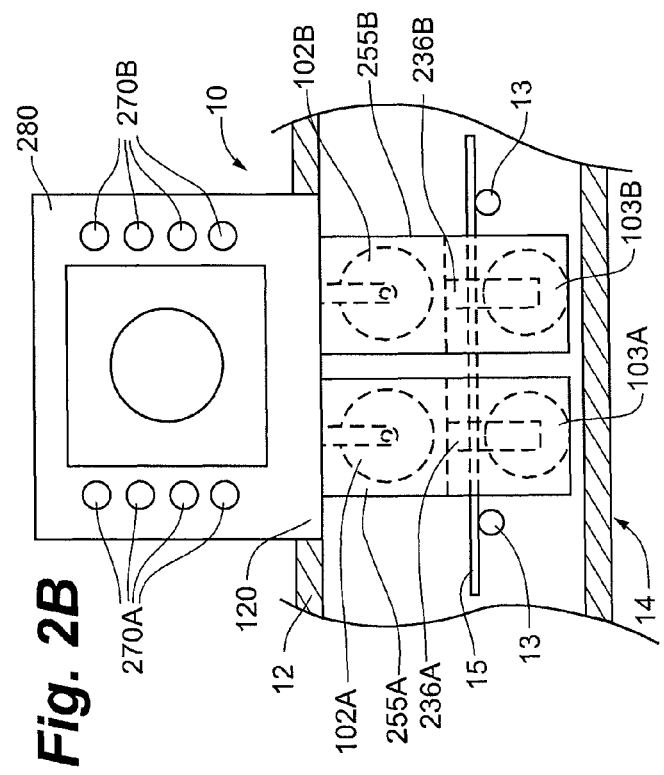
Fig. 2A
Fig. 2B

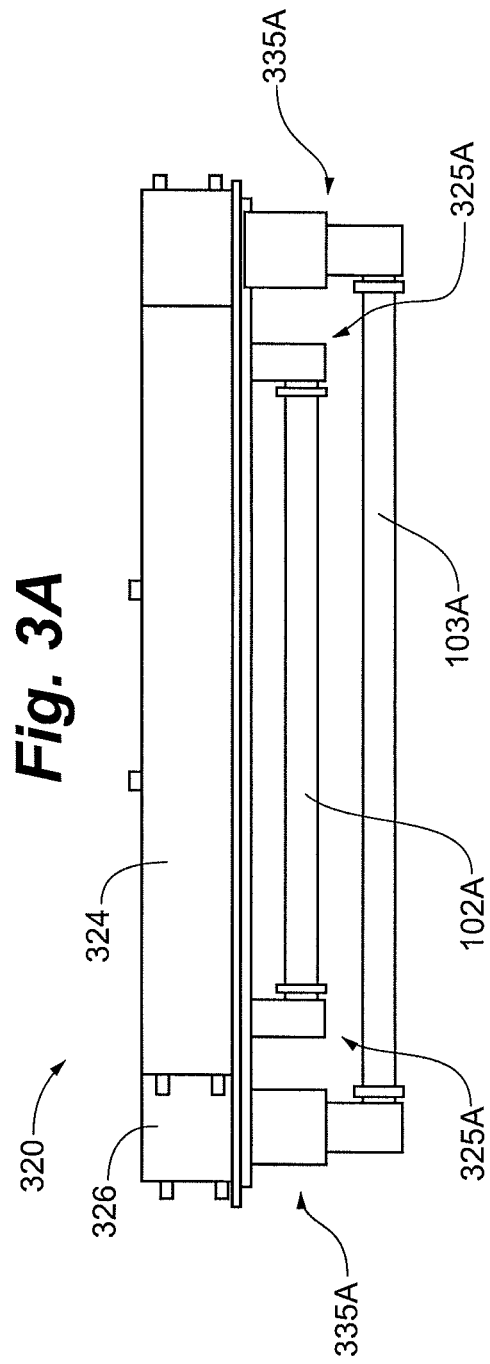

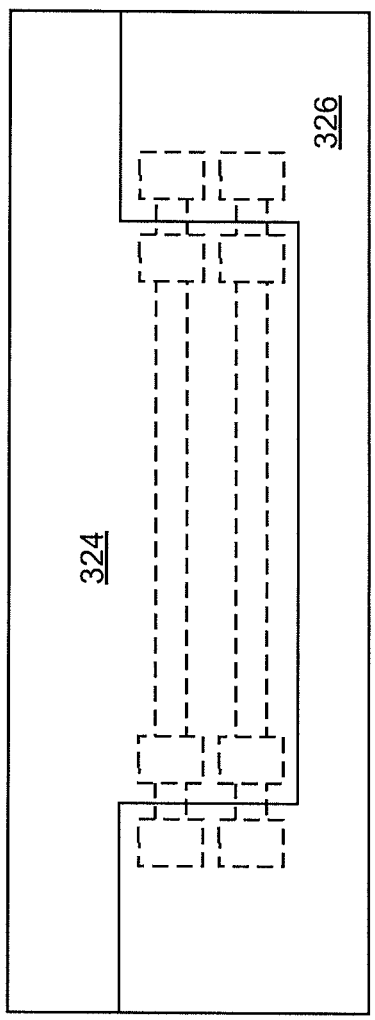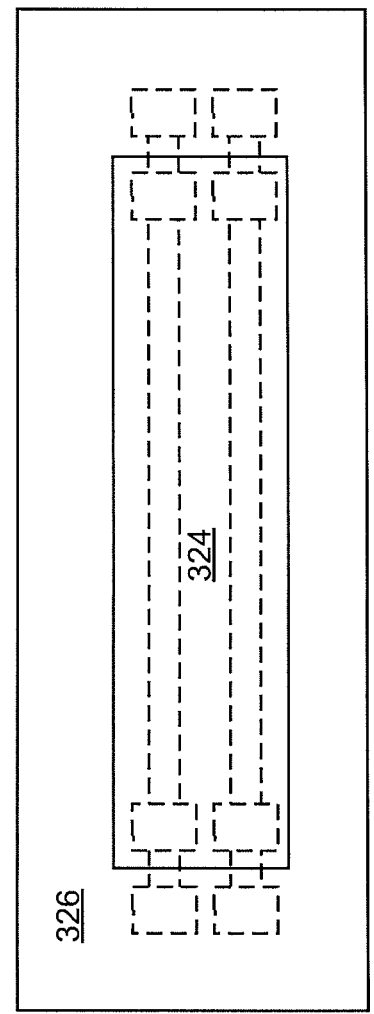

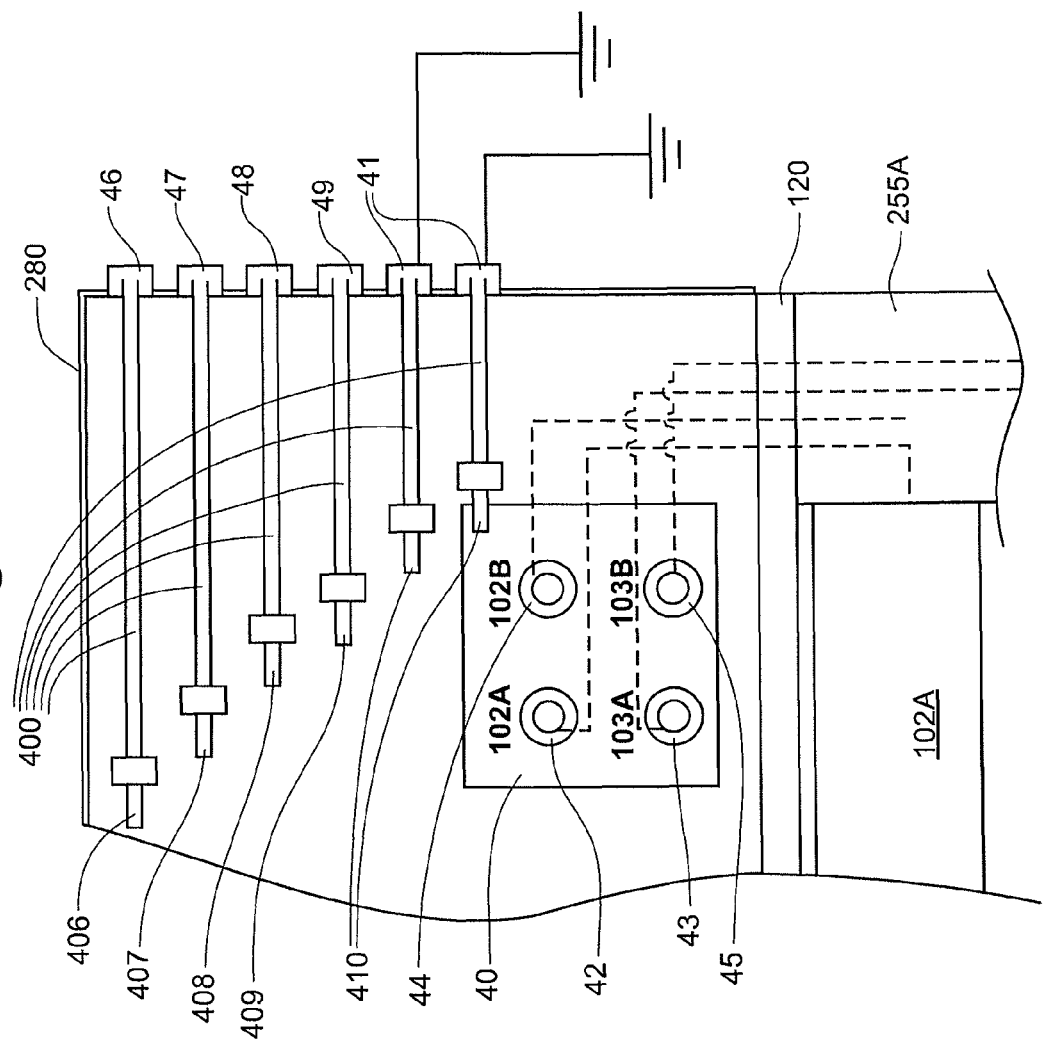

SPUTTERING APPARATUS INCLUDING TARGET MOUNTING AND CONTROL

CROSS-REFERENCE TO RELATED APPLICATIONS

This application is a continuation of U.S. application Ser. No. 11/485,615, filed Jul. 12, 2006, the contents of which are incorporated herein by reference.

TECHNICAL FIELD

The present invention pertains to the deposition of thin films via a sputtering process and more particularly to the mounting arrangement and control of sputtering targets within a sputtering chamber.

BACKGROUND

Sputtering apparatus typically employ one or more sputtering chambers through which substrates, for example, computer memory disks, integrated circuits, flat panel displays and glass sheets or panels, are conveyed for the application of thin films thereto. The substrates are coated via physical vapor deposition, which utilizes a plasma energy source, the position and density of which is controlled by a magnetic field; this process is known to those skilled in the art as "magnetron" sputtering. Magnetrons, which may be planar or cylindrical, include an electrode coupled to an array of magnets; the electrode is overlaid with a target, which includes the material that is to be deposited on the substrates. The deposition is brought about by bombardment of the target surface by ions, which are formed in a gaseous plasma and energized via a voltage applied by the electrode to the target. The terms 'magnetron' and 'sputtering target', or just 'target', are sometimes used interchangeably by those skilled in the art, and may likewise be used herein.

Often times substrates, such at those given above, by way of example, require a coating on opposing sides. Commonly assigned U.S. Pat. No. 6,964,731 discloses sputtering chambers that have been developed to include magnetrons, or sputtering targets, disposed on either side of the substrates being conveyed therethrough. However, there remains a need in the industry for improved mounting arrangements and control of sputtering targets, within sputtering chambers, that will provide an improved combination of features favorably impacting speed, expense, and ease of operator use.

SUMMARY

Embodiments of the invention pertain to a sputtering apparatus that includes a sputtering chamber (optionally, a large area sputtering chamber), a substrate conveyor, and at least two sputtering targets (e.g. a first and second target). The substrate conveyor, for example, including a series of transport rollers, extends through the chamber defining a path of substrate travel, which may extend either horizontally or vertically through the chamber, between the first and second targets. If the conveyor defines a horizontal path through the chamber, the first and second targets may be above and below, respectively, the path.

Certain embodiments of the present invention include apparatus, assemblies and methods for deploying the at least two sputtering targets within a sputtering chamber enclosed by a plurality of walls, wherein the targets are mounted to a first wall of the plurality of walls such that the first target is disposed on a first side of the substrate conveyor, and a second target is disposed on a second side of the conveyer. A substrate, for example, a glass sheet, to be sputtered coated, being conveyed through the sputtering chamber, passes between the first and second targets. According to preferred embodiments, the at least two targets includes a first pair of targets disposed on the first side of the conveyor, and a second pair of targets disposed on the second side of the conveyer; such a configuration of four targets may be called a quad configuration. The targets may be cylindrical, i.e. rotatable cylindrical magnetrons, and extend from a first end to a second end over a length which at least spans a width of the substrate being conveyed therebetween.

A sputtering target assembly, according to some embodiments of the present invention, includes the first wall, which may form a lid of the chamber, together with the targets mounted thereto. The targets mounted to the first wall as a lid, which may be a top lid, are mounted to the lid for placement within the chamber when the lid seals off an opening of the chamber. The lid and targets mounted thereto are removable from the chamber as an integral unit, thereby providing access to all the targets outside the chamber, for example, for maintenance purposes. As previously described, the first target or pair of targets is spaced apart from the second target or pair of targets to allow passage of a substrate (e.g. a glass sheet) therebetween, when the lid seals off the chamber's opening. According to some embodiments, the first wall, or lid, to which the targets are mounted, includes two separable parts, wherein the first target or pair of targets is mounted to a first of the two parts and the second target or pair of targets is mounted to a second of the two parts.

If the lid is a top lid, the first target or pair of targets can be mounted to the lid so as to be disposed side-by-side and adapted for downward sputtering, and the second target or pair of targets can be mounted to the lid so as to be disposed side-by-side and adapted for upward sputtering. In some embodiments a gas distribution system, for example including a sparge pipe, is also mounted to the lid. According to preferred embodiments, the targets are cylindrical, tube-shaped targets, optionally all being held parallel to one another in such a way as to be rotatable respectively about their horizontal axes.

According to certain methods of the present invention, each target deployed within a sputtering chamber is independently operable such that any one or a combination of more than one of the targets may be selected to be active, while remaining targets may be selected to be inactive. The selection of active and inactive targets may be made from outside the sputtering chamber by electrically connecting an electrode of an active target to a power supply, and electrically connecting an electrode of an inactive target to ground. For these embodiments a mobile shielding apparatus may be incorporated within the chamber to protect the inactive targets from being coated by material sputtered from the active targets during operation. Additional embodiments of the present invention pertain to such a mobile shielding apparatus. According to some embodiments, the mobile shielding apparatus is actuated from outside the sputter chamber. For those embodiments, which provide shielding for cylindrical targets, each moveable shield of the shielding apparatus may include first and second arcuate panels that extend between first and second ends of the cylindrical targets, and which are adapted to move with respect to one another about a circumference of the target from a first position, in which the panels protect the target from being coated by sputtered material from another target, to a second position, in which the panels allow a portion of the target to be exposed for sputtering. One or more rotatable sprockets may be disposed between the arcuate shield panels to facilitate movement of one panel with respect to the other and an external motor may be coupled to at least one of the sprockets to drive the rotation thereof.

BRIEF DESCRIPTION OF THE DRAWINGS

The following drawings are illustrative of particular embodiments of the present invention and therefore do not limit the scope of the invention. The drawings are not to scale (unless so stated) and are intended for use in conjunction with the explanations in the following detailed description. Embodiments of the present invention will hereinafter be described in conjunction with the appended drawings, wherein like numerals denote like elements.

FIG. 1 is a schematic side plan view of a portion of an exemplary sputter coating apparatus, according to some embodiments of the present invention.

FIG. 2A is a schematic front plan view of a sputtering target assembly, according to some embodiments of the present invention.

FIG. 2B is a side plan view with a partial cut-away section of a sputtering chamber including the assembly of FIG. 2A.

FIG. 3A is a front plan view of a sputtering target assembly, according to alternate embodiments of the present invention.

FIG. 3B-C are a top plan views of alternate configurations for the assembly shown in FIG. 3A.

FIG. 4 is a schematic plan view of a portion of a target assembly, according to some embodiments of the present invention.

DETAILED DESCRIPTION

Figure 5A:
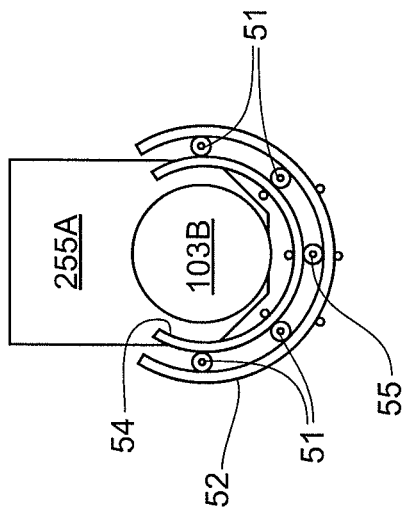
FIGS. 5A-B are schematic end views of a shielding apparatus.

The following detailed description is exemplary in nature and is not intended to limit the scope, applicability, or configuration of the invention in any way. Rather, the following description provides practical illustrations for implementing exemplary embodiments of the present invention. Examples of constructions, materials, dimensions, and manufacturing processes are provided for selected elements, and all other elements employ that which is known to those of skill in the field of the invention. Those skilled in the art will recognize that many of the examples provided have suitable alternatives that can be utilized.

FIG. 1 is a schematic side plan view of a portion of an exemplary sputter coating apparatus 100, according to some embodiments of the present invention. FIG. 1 illustrates coating apparatus 100 including sputter chambers 10, which are enclosed by a top wall 12, a bottom wall 14, and, it should be understood, two side walls (not shown); a series of transport rollers 13 serve as a conveyor of substrates 15, for example, glass panels, through chambers 10. Alternately, substrates 15 may be transported through chambers 10 by an interrupted conveyor system, according to any of the embodiments described in commonly-assigned U.S. patent application publication no. U.S. 2006/0048708, which is hereby incorporated by reference. With further reference to FIG. 1, it should be understood that partial walls segregate chambers 10 and provide tunnels through which substrates 15 pass from one chamber to the next.

FIG. 1 further illustrates a first pair of cylindrical magnetrons or sputtering targets 102A, 102B disposed on a first side, or above, the conveyor to deposit material on, or to coat an upper surface of substrates 15, and a second pair of cylindrical sputtering targets 103A, 103B disposed on a second side, or below, the conveyor to deposit material on, or to coat a lower surface of substrates 15. With reference to FIG. 1, it should be understood that each of the targets, for example, 102A, 102B, 103A and 103B, is, preferably, generally tubular, and has a length that extends into the page, and, according to preferred embodiments of the present invention, the length of each target at least spans a width of substrate 15. According to preferred embodiments of the present invention, substrates 15 are glass sheets or panels having a length from approximately 24 inches to approximately 144 inches, and having a width from approximately 18 inches (about 0.46 meters) to approximately 100 inches (about 2.5 meters). Some exemplary embodiments of the present invention include commercially available cylindrical magnetrons, one example of which has a target length of approximately 96 inches, for example, to accommodate a glass panel-type substrate having a width of approximately 84 inches, and another example of which has a target length of approximately 126 inches, for example, to accommodate a glass panel-type substrate having a width of approximately 100 inches. Other commercially available lengths include 84 inches, 105 inches and 114 inches.

According to the illustrated embodiment, as substrates 15 are conveyed through a vacuum environment of chambers 10, for example, from left to right, both sides of substrates 15 may be simultaneously coated in each chamber 10 via the bombardment of each sputtering target pair by ions of a process gas, for example, argon, nitrogen, and/or oxygen, which are pumped into each chamber 10 as targets 102A, 102B, 103A and 103B are rotated about their longitudinal axes according to methods known to those skilled in the art. Some examples of dual direction sputtering chambers are described in commonly assigned U.S. Pat. No. 6,964,731, salient portions of which are hereby incorporated by reference.

The system depicted in FIG. 1 exemplifies embodiments wherein a sputtering chamber is equipped with at least one sputter-down target mounted to a top wall of the chamber and at least one sputter-up target also mounted to the top wall. According to these embodiments, the at least one sputter-down target is a pair of sputter-down targets held side-by-side, preferably parallel to one another, and the at least one sputter-up target is a pair of targets held side-by-side, preferably parallel to one another, and spaced apart from the sputter-down targets. The pair of sputter-down targets are held at a first distance from the top wall and the pair of sputter-up targets held at a second distance from the top wall; the first distance may be between approximately 10.75 inches and approximately 11 inches and the second distance may be between approximately 22.5 inches and approximately 22.75 inches.

According to certain embodiments of the present invention, each sputtering target in each chamber 10, for example each of targets 102A, 102B, 103A and 103B, is mounted to a single wall of each chamber 10, the wall being separable from the chamber to provide access outside the chamber to all of the targets for maintenance purposes, for example, to swap out expired or consumed targets; such mounting may thereby further increase operational efficiency. Although exemplary embodiments of the present invention, as described herein, show the targets mounted to a wall disposed above the conveyor, for example, to top wall 12 (FIG. 2B), the scope of the present invention is not so limited, and the targets may all be mounted to any of the walls of chambers 10.

FIG. 2A is a schematic front plan view of a sputtering target assembly 20, according to some embodiments of the present invention; and FIG. 2B is a side plan view with a partial cut-away section of sputtering chamber 10 including assembly 20. FIG. 2A illustrates target assembly 20 including a wall portion 120 and end blocks 245A and 255A coupled thereto, for example, via bolted joints; portions of assemblies coupling targets 102A and 103A to wall portion 120 are shown housed within end blocks 245A, 255A. With reference to FIGS. 1 and 2B, it should be understood that another pair of end blocks 245B and 255B are coupled to wall portion 120 to house assemblies for targets 102B and 103B, which are behind targets 102A and 103A in FIG. 2A.

According to the illustrated embodiment, targets 103A,B are spaced apart from targets 102A,B at a distance that allows passage of a substrate, for example, substrate 15, horizontally conveyed between targets 102A,B and 103A,B. Substrate 15 may be a glass sheet or panel, for which horizontal conveyance, as illustrated, is preferred, but the scope of the present invention is not limited to horizontal conveyance. FIG. 2B illustrates wall portion 120 fitting into upper wall 12 of chamber 10 such that targets 103A-B are disposed below transport rollers 13 and substrate 15, while targets 102A-B are disposed above rollers 13 and substrate 15. Although assembly 20 includes target pairs 102A-B and 103A-B, the scope of the present invention is not limited as such, and embodiments of target assemblies may include a single first target mounted for positioning on one side of a substrate conveyer and a single second target mounted for positioning on the other side of the substrate conveyor, or may include more than two targets mounted for positioning on each side the conveyor. With reference to FIG. 2B, it may be appreciated that wall portion 120 can form a separable lid for chamber 10; as such, wall portion 120 is sized and equipped to seal off an opening in wall 12, when chamber 10 is operating, and to be removed, for example, by raising portion 120 away from chamber 10, when maintenance of target assembly 20 is required, for example, to swap out expired targets.

FIGS. 2A-B further illustrate a cover or housing 280 disposed over a top of wall portion 120 to enclose portions of the assemblies that provide utility hookups for targets 102A,B and 103A,B. The assemblies include motors 23A,B and 22A,B (23B and 22B being disposed behind 23A and 22A, respectively, in FIG. 2A), one motor to rotate each of targets 102A,B and 103A,B, water lines (not shown) connecting into either end of each target 102A,B, 103A,B and electrical lines (not shown) to power an electrode of each target 102A,B, 103A,B and to power each motor 23A,B, 22A,B. Feedthrough openings for utility hookups are provided through wall portion 120 into end blocks 245A,B and 255A,B; for example, as illustrated in FIG. 2A, a drive chain or belt 203A extends from motor 23A to a first spindle end 213A of target 103A, and a drive chain or belt 202A extends from motor 22A to a first spindle end 212A of target 102A. Any suitable arrangement of utility hookups may be implemented according to methods known to those skilled in the art for powering and cooling sputtering targets. FIG. 2B further illustrates feedthrough openings 270A and 270B extending through an end wall of housing 280 to facilitate connection of water and electrical lines with external sources. It should be noted that assembly 20 may further include a gas delivery system, which may include a sparge pipe for dispersing process gas, for example, argon, nitrogen, and/or oxygen, within chamber 10, and one of feedthroughs 270A,B may facilitate coupling of the pipe to a external gas source. FIG. 2A further illustrates second spindle ends, or journals 216A and 246A of targets 102A and 103A, respectively, inserted in bearing supports 226A and 236A, respectively. It should be understood that targets 102B and 103B, disposed behind targets 102A and 103A in FIG. 2A, likewise include second spindle ends 216B and 246B inserted in bearing supports 226B and 236B, respectively, which are disposed behind supports 226A and 236A within end blocks 245B and 255B, respectively, in FIG. 2A.

FIG. 3A is a front plan view of a sputtering target assembly 320, according to alternate embodiments of the present invention. FIG. 3A illustrates target assembly 320 including a first part 324, to which end blocks 325A are coupled, and a second part 326, to which end blocks 335A are coupled; end blocks 325A and 335A enclose assemblies that couple targets 102A and 103A, respectively, to first part 324 and second part 326, respectively, and portions of assemblies that provide utility hookups for targets 102A and 103A; these assemblies may be similar to those described in conjunction with FIGS. 2A-B. It should be understood that end blocks 325B and 335B and associated targets 102B and 103B are disposed behind end blocks 325A and 335A and targets 102A and 103A, respectively, for example, as shown by dashed lines in FIGS. 3B-C; however, alternate embodiments of the present invention may only include one target mounted to each part 324, 326. As with assembly 20, first and second parts 326, 324, together, may form a lid to fit within and seal off an opening in a wall of a sputtering chamber, for example chamber 10, such that targets 102A-B and 103A-B are disposed on either side of a substrate conveyor, such as is illustrated in FIG. 1. According to an exemplary embodiment of the present invention, targets 103A-B are sufficiently long to accommodate a length of targets 102A-B, which is, preferably, approximately 96 inches to coat glass sheets being approximately 84 inches wide.

According to the illustrated embodiment, first lid portion 324 is separable from second lid portion 326 to provide full access to target pair 102A-B, without having to remove target pair 103A-B. Additionally, the entire assembly 320 need not be separated from a wall of a sputtering chamber, for example chamber 10, in order to access individual target pairs 102A-B and 103A-B. FIG. 3B is a top plan view of assembly 320 according to one configuration of first and second parts 324 and 326, and FIG. 3C is a top plan view of assembly 320 according to an alternate configuration of first and second parts 324 and 326. According to the embodiment illustrated in FIG. 3B, either of first and second parts 324 and 326 can be removed from wall 12 while the other remains in place.

With reference back to FIG. 1, according to some embodiments of the present invention, each of targets, or magnetrons 102A-B and 103A-B are independently operable so that an operator of sputtering apparatus 100 may select to be operable, or active, one, some, or all of the magnetrons, for example, via a switchboard-type network as illustrated in FIG. 4, according to an exemplary embodiment. The terms 'operable' and 'active' are used herein to denote a magnetron that is functional and whose electrode is coupled to a power supply. FIG. 4 is a schematic plan view of a portion of target assembly 20 showing a switchboard 40 that is mounted within cover 280 and includes connector ports 42, 44, 43 and 45 to receive connector plugs 406, 407, 408, 409 and 410, also disposed within cover 280; each port 42, 44, 43 and 45 is shown, by the dashed lines, to be electrically coupled to an electrode of a corresponding target 102A, 102B, 103A, 103B, for example, via electrical wire hookups extending through end block 255A to targets 102A, 103A, and through end block 255B to targets 102B, 103B. (Reference FIG. 2B.) FIG. 4 further shows each of plugs 406-410 electrically coupled by a flexible conductor cord or cable 400 to one of connections 46, 47, 48, 49 and 41 mounted on an external surface of cover 280. With reference to FIG. 4, along with the following description, it should be appreciated that such a switchboard-type network facilitates powering of electrodes for any one or a combination of magnetrons 102A,B, 103A,B by allowing an operator to reconfigure plugs 406-410 beneath cover 280 without having to break a vacuum of a sputter chamber to gain direct access to magnetrons 102A,B, 103A,B.

According to the illustrated embodiment, a power supply (not shown) may be coupled to any two connectors of connectors 46-49, and an operator may select a pair of targets 102A, 102B, 103A, 103B for coupling to the power supply by plugging the corresponding pair of connector plugs from connector plugs 406-409 into the selected ports of ports 42, 44, 43, 45 corresponding to the selected targets. For example, if all of targets 102A, 102B, 103A, 103B are selected to be operable, a first power supply is coupled to connectors 46 and 47, which are, in turn coupled to connector ports 42 and 44 for targets 102A and 102B, respectively, via plugs 406 and 407, and a second power supply is coupled to connectors 48 and 49, which are, in turn, coupled to connector ports 43 and 45 for targets 103A and 103B, respectively, via plugs 408 and 409. Alternately, if any one of targets 102A,B, 103A,B has become non-operational, for example due to target depletion, the operator may decide to continue operation with only two of the remaining operational targets by detaching one of the power supplies, re-configuring the electrical connection of the other power supply, if necessary, and grounding the non-operational, or inactive target(s) by plugging ground connector plugs 410 into the corresponding ports of switchboard 40. For example, if target 102A fails, the first power supply is disconnected from connectors 46 and 47, plug 406 is removed from port 42, and one of plugs 410 is plugged into port 42 to ground the electrode of target 102A; then, the operator selects two of remaining targets 102B, 103A,B for continued sputtering operation. If the operator selects 102B and 103B for continued operation, plug 408 is removed from port 43 so that the electrode of target 103A may be grounded, for example, via a second of plugs 410, and then plug 408 is switched out with plug 407, in port 44, so that the second power supply, which is coupled to connectors 48 and 49 is now connected to power the electrodes of targets 102B and 103B.

Figure 5B:
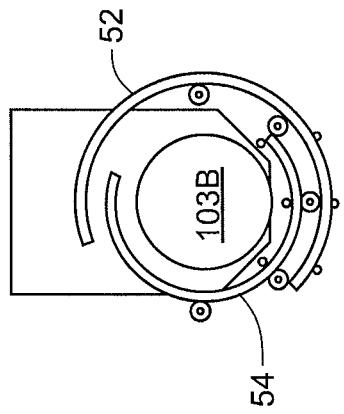
Figure 5C:
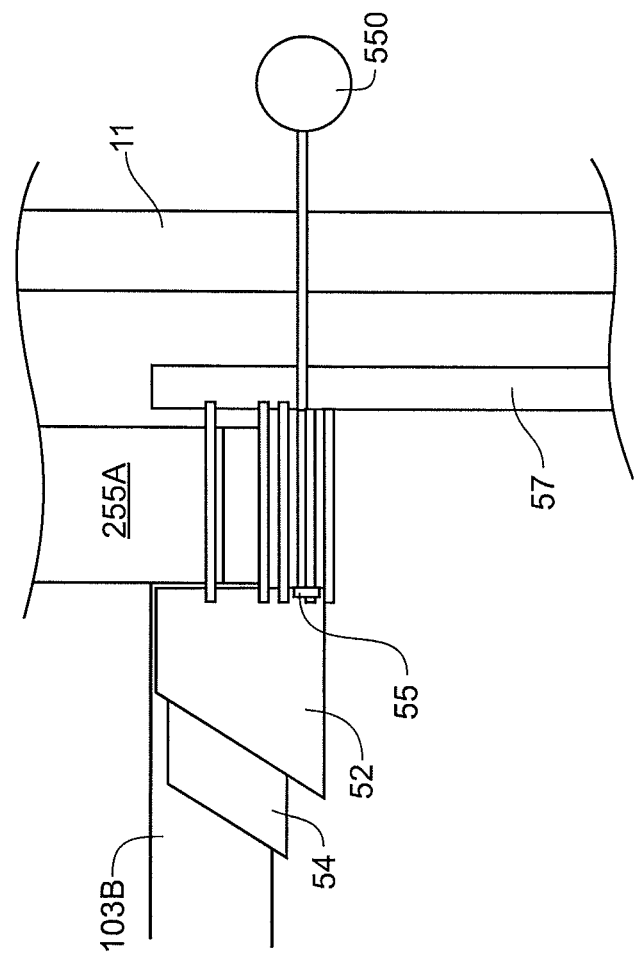
FIG. 5C is a schematic side view of the apparatus as depicted in FIG. 4A.

It may be necessary to shield inactive targets, which are in the same chamber as active targets, so that the inactive targets are not coated by material sputtered from the operational targets. FIGS. 5A-B are schematic end views of a portion of an externally activated mobile shielding apparatus; and FIG. 5C is a schematic side view of the apparatus as depicted in FIG. 5A. FIGS. 5A-C illustrate a pair of moveable arcuate shield panels 52, 54 disposed about target 103B and supported by sprockets 51, 55 that project from a supporting structure 57 residing within a sputter chamber and extending alongside a wall 11 of the chamber in proximity to end block 255A. According to the illustrated embodiment, sprockets 51, 55 mate with an outer surface of shield panel 54 and an inner surface of shield panel 52 such that a rotation of at least sprocket 55, as the drive sprocket, moves shield panels 52, 54 relative to one another from an open position, illustrated in FIG. 5A, wherein target 103B is exposed for sputtering, to a closed position, illustrated in FIG. 5B, wherein target 103B is shielded or protected from being coated by material sputtered by other active targets in the chamber. Shield panels 52, 54 may be formed from stainless steel or aluminum, or any other suitable heat-resistant, relatively light weight and formable material known to those skilled in the art. Likewise, sprockets 51, 55 may be formed from any suitable material known to those skilled in the art, examples of which include, without limitation, carbon or stainless steel metals and relatively hard polymers.

FIG. 5C further illustrates a feedthrough line through chamber wall 11 joining drive sprocket 55 to an external motor 550 so that shield panels 52, 54 may be actuated to move between the opened and closed positions from outside the chamber. Such a shielding apparatus may be implemented for each target within a sputtering chamber, for example, for each of targets 102A,B and 103A,B as described above. With reference to FIG. 5C, it should be understood that shield panels 52 and 54 are cut away for illustrative purposes, and, in actuality, each would extend along a length of target 103B to opposing end block 245A (FIG. 2A); according to some embodiments, the opposite end of shield panels 52, 54 are supported by at least supporting sprockets, i.e. sprockets 51, extending from another supporting structure 57 located in proximity to end block 245A within the chamber.

In the foregoing detailed description, the invention has been described with reference to specific embodiments. However, it may be appreciated that various modifications and changes can be made without departing from the scope of the invention as set forth in the appended claims.

The invention claimed is:
1. A sputtering target assembly for a single sputtering chamber of a sputter coating apparatus, comprising:
   a lid to seal off an opening to the chamber, the lid including a first part and a second part, the first part being separable from the second part;
   a first pair of sputtering targets mounted to the first part of the lid for placement within the chamber, at a first distance from the lid, when the lid seals off the opening, each target of the first pair of sputtering targets being cylindrical and including a longitudinal axis about which the corresponding target of the first pair rotates, and both longitudinal axes of the first pair being located at the first distance, when the lid seals off the chamber; and
   a second pair of sputtering targets mounted to the second part of the lid for placement within the chamber, at a second distance from the lid, when the lid seals off the opening, each target of the second pair of sputtering targets being cylindrical and including a longitudinal axis about which the corresponding target of the second pair rotates, and both longitudinal axes of the second pair being located at the second distance, when the lid seals off the chamber;
   wherein the second distance is greater than the first distance such that the second pair of sputtering targets are spaced apart from the first pair of sputtering targets to allow conveyance of a substrate in between the first and second pairs of sputtering targets in a direction approximately parallel with the lid, when the lid seals off the opening; and the longitudinal axis of each of the first pair of sputtering targets is aligned with the longitudinal axis of the corresponding target of the second pair of sputtering targets in order that both/opposing sides of the substrate can be simultaneously coated by the first and second pairs of sputtering targets when conveyed therebetween.

2. The assembly of claim 1, wherein the opening extends over a top of the chamber.

3. The assembly of claim 1, wherein the at least one first sputtering target comprises of a pair of first targets and the at least one second sputtering target comprises a pair of second targets.

4. The assembly of claim 1, wherein each of the pair of first targets is independently operable and each of the pair of second targets is independently operable, such that one target of each of the pairs can be activated, while another target of each pair can be inactivated.

5. The assembly of claim 1, wherein the at least one first target and the at least one second target are independently operable, such that one of the at least one first target and the at least one second target can be activated while the other is inactivated.

6. The assembly of claim 1, wherein:
the lid includes a first part and a second part, the first part being separable from the second part;
the at least one first target is mounted to the first part; and
the at least one second target is mounted to the second part.

7. The assembly of claim 6, wherein the first part surrounds at least a portion of the second part, when the lid seals off the opening to the chamber.

8. The assembly of claim 1, wherein each of the at least one first target and each of the at least one second target are cylindrical and extend from a first end to a second end, and further comprising:
a first end block coupled to the lid and housing an assembly that couples one of the first and second ends of each of the at least one first target to the lid; and
a second end block coupled to the lid and housing an assembly that couples one of the first and second ends of each of the at least one second target to the lid.

9. The assembly of claim 1, wherein the substrate is conveyed between the at least one first target and the at least one second target by a series of spaced-apart transport rollers defining a path of substrate travel, and the at least one first target is disposed above the path and the at least one second target is disposed below the path, when the lid seals off the opening.

10. The assembly of claim 1, wherein each of the at least one first sputtering target and each of the at least one second sputtering target are cylindrical and adapted for rotation about a longitudinal axis thereof.

11. The assembly of claim 10, further comprising:
at least one first rotary drive coupled to an end of the at least one first target; and
at least one second rotary drive coupled to an end of the at least one second target.

12. The assembly of claim 1, further comprising:
a first connector port electrically coupled to an electrode of the at least one first target; and
a second connector port electrically coupled to an electrode of the at least one second target;
wherein the first and second ports are mounted to the lid such that the ports are disposed outside the sputtering chamber, when the lid seals off the opening; and
the first and second ports are adapted to receive a connector plug electrically coupled to either a power supply or a grounded connection so that one of the at least one first target and the at least one second target can be selected to be active by coupling to the power supply, and another of the at least one first target and the at least one second target may be selected to be inactive by coupling to the grounded connection.

13. The assembly of claim 1, wherein the at least one first sputtering target comprises of a pair of first targets and the at least one second sputtering target comprises a pair of second targets, and further comprising:
a pair of first connector ports, each of the pair of first ports electrically coupled to a corresponding electrode of each of the pair of first targets; and
a pair of second connector ports, each of the pair of second ports electrically coupled to a corresponding electrode of each of the pair of second targets;
wherein the pairs of first and second ports are mounted to the lid such that the ports are disposed outside the sputtering chamber, when the lid seals off the opening; and
each port of the first and second pairs of ports are adapted to receive a connector plug electrically coupled to either a power supply or a grounded connection so that any one or a combination of the first targets and the second targets can be selected to be active by coupling to the power supply, and the remaining targets can be selected to be inactive by coupling to the grounded connection.

14. A method for deploying sputtering targets in a single sputtering chamber of a sputter coating apparatus, the method comprising:
removing a first portion of a lid from over an opening of the single sputtering chamber, while leaving a second portion of the lid in place over the opening, the first portion of the lid having a first pair of cylindrical sputtering targets mounted thereto, and the second portion of the lid having a second pair of cylindrical sputtering targets mounted thereto;
dismantling at least one of the first pair of cylindrical sputtering targets from the first portion of the lid;
mounting a replacement cylindrical sputtering target to the first portion of the lid of the chamber in place of each of the at least one of the first pair of cylindrical sputtering targets that was dismantled from the first portion of the lid; and
placing the first portion of the lid together with the second portion of the lid, which was left in place over the opening of the chamber, after mounting the at least one replacement cylindrical sputtering target thereto, to seal off the opening, such that the first pair of mounted cylindrical sputtering targets, including the at least one replacement cylindrical target, is spaced apart from the mounted second pair of cylindrical sputtering targets to allow a substrate, being conveyed through the chamber in a direction approximately parallel with the lid, to pass in between the first and second pairs of mounted cylindrical sputtering targets; and
wherein a longitudinal axis of each of the first pair of mounted cylindrical sputtering targets is aligned with a longitudinal axis of the corresponding target of the second pair of mounted cylindrical sputtering targets in order that both/opposing sides of the substrate can be simultaneously coated by the first and second pairs of mounted cylindrical sputtering targets when passing in between the mounted targets.

15. The method of claim 14, wherein placing the lid comprises lowering the lid over the opening, and wherein the at least one mounted first target is disposed above the at least one mounted second target within the chamber when the lid is placed.

16. The method of claim 14, further comprising:
activating the at least one mounted first target to deposit material on a surface of the substrate as the substrate passes between the mounted targets; and
shielding the at least one mounted second target against sputtering from the at least one first target.

17. The method of claim 16, wherein shielding the at least one mounted second target comprises actuating a moveable shield from outside the chamber.

18. The method of claim 14, wherein the at least one first target comprises a pair of first targets and the at least one second target comprises a pair of second targets, and further comprising:
activating one of the pair of first targets to deposit material on a first surface of the substrate as the substrate passes between the mounted targets;
shielding the other of the pair of first targets;
activating one of the pair of second targets to deposit material on a second surface of the substrate as the substrate passes between the mounted targets; and
shielding the other of the pair of second targets.

19. The method of claim 18, wherein:
shielding the other of the pair of first targets comprises actuating a first moveable shield from outside the chamber; and
shielding the other of the pair of second targets comprises actuating a second moveable shield from outside the chamber.

20. The method of claim 14, wherein, when the lid is placed over the opening, the at least one mounted first target is disposed above the substrate being conveyed through the chamber and the at least one mounted second target is disposed below the substrate being conveyed through the chamber.

21. The method of claim 14, wherein the first portion of the lid is separable from the second portion of the lid, and further comprising:
removing the first portion of the lid from the opening by separating the first portion from the second portion; and
dismantling at least one spent target from the first portion of the lid prior to mounting the at least one first target to the first portion of the lid.

22. The method of claim 14, wherein removing the first portion of the lid comprises raising the first portion and the spent target together, as an integral unit, away from the chamber.

23. The method of claim 14, wherein the second portion of the lid remains over the opening of the chamber while removing the first portion and dismantling the spent target.

24. The method of claim 14, wherein the at least one first target comprises a pair of first targets and the at least one second target comprises a pair of second targets, and further comprising:
electrically disconnecting electrodes of two targets of the pairs of first and second targets from at least one power supply, one of the two targets having been detected as being non-operational; and
electrically grounding the disconnected electrodes;
wherein disconnecting and grounding are accomplished after placing the lid and without removing the lid from over the opening.

25. The method of claim 24, further comprising:
electrically disconnecting an electrode of one of another two targets of the pairs of the first and second targets from a first power supply of the at least one power supply; and
electrically connecting the electrode of the one of the other two targets to a second power supply of the at least one power supply;
wherein an electrode of another of the other two targets is already connected to the second power supply; and
disconnecting and connecting the electrode of the one of the other two targets is accomplished after placing the lid and without removing the lid from the opening.

26. The sputtering target assembly according to claim 1 wherein the at least one first sputtering target is solely mounted to a first portion of the lid and the at least one second sputtering target is solely mounted to a second portion of the lid wherein the combination of the first portion of the lid and the second portion of the lid seals off the opening in the chamber and the first position of the lid may, be removed from the opening separately from the second portion of the lid so that the at least one first sputtering target may be serviced separately from the at least one second sputtering target.

27. The sputtering target assembly according to claim 1 wherein the lid can be removed from the opening thereby removing the at least one first sputtering target and the at least one second sputtering target.

28. The apparatus of claim 5, wherein:
each of the at least one first target and each of the at least one second target are cylindrical and extend from a first end to a second end;
and further comprising:
a first moveable shield including first and second arcuate panels extending between the first and second ends of one of the at least one first target, the first and second panels of the first shield being adapted to move with respect to one another about a circumference of the first target from a first position, in which the panels of the first shield protect the first target from being coated by sputtered material, to a second position in which the panels of the first shield allow at least a portion of the first target to be exposed for sputtering;
a second moveable shield including first and second arcuate panels extending between the first and second ends of one of the at least one second target, the first and second panels of the second shield being adapted to move with respect to one another about a circumference of the second target from a first position, in which the panels of the second shield protect the second target from being coated by sputtered material, to a second position, in which the panels of the second shield allow at least a portion of the second target to be exposed for sputtering.

29. The apparatus of claim 28, wherein:
the first moveable shield further includes a drive sprocket mating with an outer surface of the first arcuate panel of the first shield and an inner surface of the second arcuate panel of the first shield such that rotation of the drive sprocket moves the first arcuate panel of the first shield with respect to the second arcuate panel of the first shield; and the second moveable shield further includes a drive sprocket mating with an outer surface of the first arcuate panel of the second shield and an inner surface of the second arcuate panel of the second shield such that rotation of the drive sprocket of the second shield moves the first arcuate panel of the second shield with respect to the second arcuate panel of the second shield.

* * * * *